(12) United States Patent
Okamoto

(10) Patent No.: US 7,800,114 B2
(45) Date of Patent: Sep. 21, 2010

(54) SEMICONDUCTOR DEVICE AND MANUFACTURING METHOD THEREOF

(75) Inventor: Satoru Okamoto, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 141 days.

(21) Appl. No.: 12/116,384

(22) Filed: May 7, 2008

(65) Prior Publication Data

US 2008/0251845 A1 Oct. 16, 2008

Related U.S. Application Data

(62) Division of application No. 11/080,769, filed on Mar. 15, 2005, now Pat. No. 7,374,983.

(30) Foreign Application Priority Data

Apr. 8, 2004 (JP) ............................. 2004-113724

(51) Int. Cl.
*H01L 27/14* (2006.01)

(52) U.S. Cl. ............................. 257/72; 257/59; 257/258; 257/336; 257/344; 257/346; 257/365; 257/366; 257/359; 257/387; 257/408; 257/E27.133

(58) Field of Classification Search .................. 257/59, 257/72, 258, E27.133, 336, 344, 346, 365, 257/366, 359, 387, 408
See application file for complete search history.

(56) References Cited

U.S. PATENT DOCUMENTS

| | | | |
|---|---|---|---|
| 5,851,861 A | 12/1998 | Suzawa et al. | |
| 6,259,138 B1 | 7/2001 | Ohtani et al. | |
| 6,274,887 B1 | 8/2001 | Yamazaki et al. | |
| 6,303,963 B1 | 10/2001 | Ohtani et al. | |
| 6,365,917 B1 | 4/2002 | Yamazaki | |
| 6,531,713 B1 | 3/2003 | Yamazaki | |
| 6,545,359 B1 | 4/2003 | Ohtani et al. | |
| 6,562,671 B2 | 5/2003 | Ohnuma | |
| 6,596,571 B2 | 7/2003 | Arao et al. | |
| 6,611,108 B2 | 8/2003 | Kimura | |
| 6,646,287 B1 | 11/2003 | Ono et al. | |
| 6,646,692 B2 | 11/2003 | Yamazaki et al. | |
| 6,690,437 B2 | 2/2004 | Yamazaki et al. | |
| 6,706,544 B2 | 3/2004 | Yamazaki et al. | |
| 6,737,306 B2 | 5/2004 | Yamazaki et al. | |

(Continued)

FOREIGN PATENT DOCUMENTS

EP   1 006 589 A2   6/2000

OTHER PUBLICATIONS

Office Action re Chinese application No. CN 200510064845.8, dated Nov. 30, 2007 (with English translation).

*Primary Examiner*—Tan N Tran
(74) *Attorney, Agent, or Firm*—Husch Blackwell Sanders LLP

(57) ABSTRACT

Manufacture of TFTs corresponding to various circuits makes structures thereof complex, which involves a larger number of manufacturing steps. Such an increase in the number of the manufacturing steps leads to a higher manufacturing cost and a lower manufacturing yield. In the invention, a high concentration of impurities is doped by using as masks a tapered resist that is used for the manufacture of a tapered gate electrode, and the tapered gate electrode, and then the tapered gate electrode is etched in the perpendicular direction using the resist as a mask. A semiconductor layer under the thusly removed tapered portion of the gate electrode is doped with a low concentration of impurities.

25 Claims, 16 Drawing Sheets

U.S. PATENT DOCUMENTS

| | | |
|---|---|---|
| 6,747,289 B2 | 6/2004 | Yamazaki et al. |
| 6,759,678 B2 | 7/2004 | Yamazaki et al. |
| 6,794,229 B2 | 9/2004 | Asami et al. |
| 6,809,339 B2 | 10/2004 | Suzawa et al. |
| 6,825,488 B2 | 11/2004 | Yamazaki et al. |
| 6,847,341 B2 | 1/2005 | Kimura et al. |
| 2003/0027382 A1 | 2/2003 | Uehara et al. |
| 2003/0122132 A1* | 7/2003 | Yamazaki .................... 257/72 |

* cited by examiner

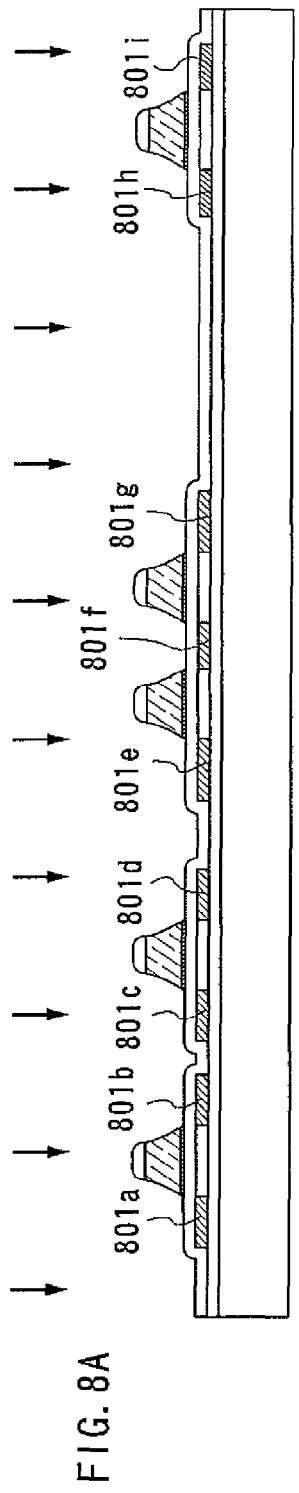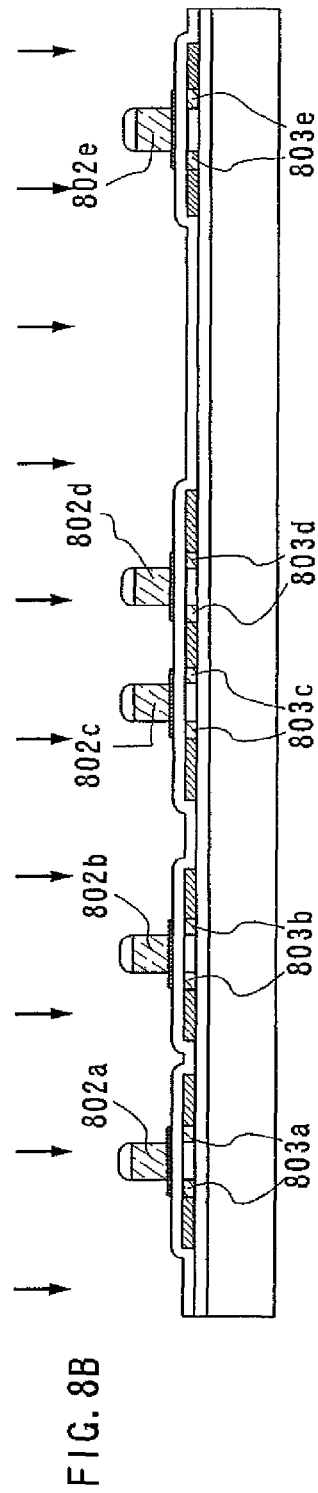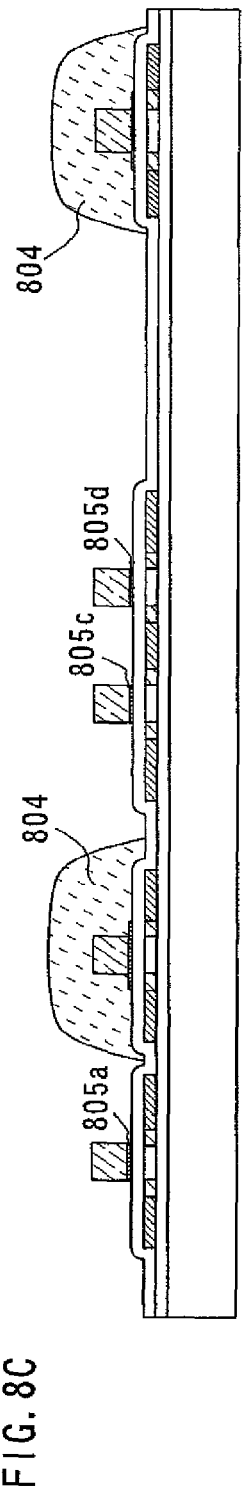

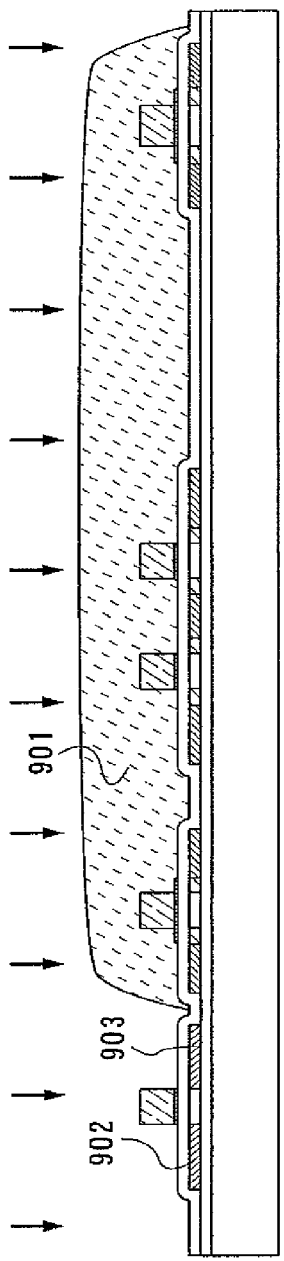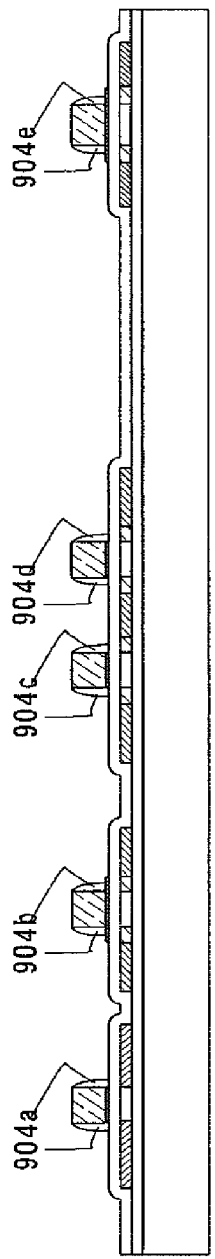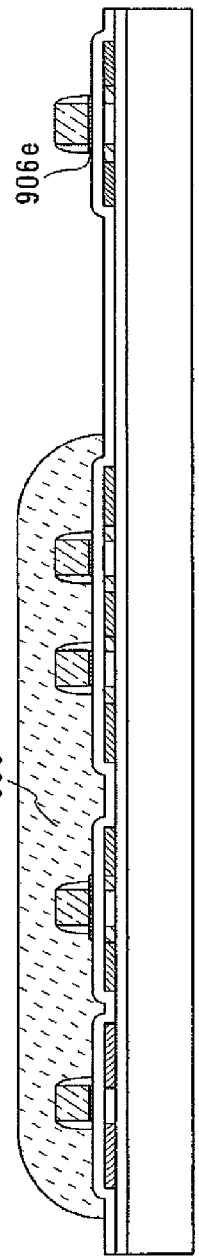

US 7,800,114 B2

SEMICONDUCTOR DEVICE AND MANUFACTURING METHOD THEREOF

This application is a divisional of U.S. application Ser. No. 11/080,769, filed on Mar. 15, 2005 now U.S. Pat. No. 7,374,983.

BACKGROUND OF THE INVENTION

1. Field of the Invention

The present invention relates to a semiconductor device where a circuit comprising thin film transistors is formed over a substrate having an insulating surface, and a manufacturing method thereof.

2. Description of the Related Art

Display devices of which pixel portion is constructed by arranging active elements are referred to as active matrix display devices. Among them, a liquid crystal display device and an electroluminescence (hereinafter also referred to as EL) display device and the like have been developed. As an active element, a gate insulated transistor is typically used, and preferably a thin film transistor (hereinafter also referred to as a TFT) is used. A TFT is obtained by forming a semiconductor film over a substrate such as glass by vapor phase growth and the like, and then forming a channel region, a source region, a drain region and the like using the semiconductor film. The semiconductor film is preferably formed of silicon or a material such as silicon germanium that contains silicon as its main component. The semiconductor film can be classified into an amorphous semiconductor film and a crystalline semiconductor film.

In a TFT whose active layer is formed of an amorphous semiconductor film, it has been almost impossible to obtain field effect mobility of 10 $cm^2/V \cdot sec$ or more because of the electron properties of the amorphous structure. Therefore, even though the TFT can be used as a switching element (hereinafter also referred to as a pixel TFT) for driving liquid crystals in a pixel portion of an active matrix liquid crystal display device, it is impossible to construct a driver circuit for image display by using such a TFT. Thus, mounting techniques of driver ICs using TAB (Tape Automated Bonding) or COG (Chip on Glass) bonding are adopted for the driver circuit.

As for a TFT whose active layer is formed of a crystalline semiconductor film, on the other hand, high field effect mobility is obtained, which can thus be used for constructing various functional circuits to be driven. Thus, a driver circuit comprising a shift register circuit, a level shifter circuit, a buffer circuit, a sampling circuit and the like can be formed over the same glass substrate as the pixel TFTs. A driver circuit is basically constructed by a CMOS circuit comprising an N-channel TFT and a P-channel TFT. Based on such mounting techniques of a driver circuit, it is considered that a TFT whose active layer is formed of a crystalline semiconductor film, which enables the integral formation of a pixel portion and a driver circuit over the same substrate, is suitably employed in order to advance weight saving and slimming of a liquid crystal display device or an EL display device.

As set forth above, in order to form a pixel portion and a driver circuit over the same substrate, TFTs corresponding to the function of each of the various circuits are required to be formed. This is because, operating conditions of pixel TFTs are not necessarily identical to those of TFTs in a driver circuit, and the respective TFTs are thus required to have different properties. Pixel TFTs constituted by N-channel TFTs are used as switching elements to apply a voltage to liquid crystals. The liquid crystals are driven by a DC voltage, therefore, a method called a frame inversion drive is often adopted. A pixel TFT is required to have a sufficiently small off-current in order to store a charge accumulated in a liquid crystal layer within one frame period. On the other hand, a buffer circuit and the like in a driver circuit is applied with a high drive voltage, therefore, a withstand voltage is required to be increased so that the elements are not broken by the high voltage applied. In addition, in order to obtain a high on-current drive capacity, it is necessary to secure a sufficiently large on-current.

As a structure of a TFT for decreasing off-current, there is the one having a low concentration drain region (hereinafter also referred to as a LDD region). This structure has a region doped with impurity elements at a low concentration between a channel region and each of source and drain regions that are doped with impurity elements at high concentration. Also, there is a so-called GOLD (Gate-drain Overlapped LDD) structure in which a LDD region is formed to overlap a gate electrode with a gate insulating film interposed therebetween as a means for preventing on-current from decreasing due to hot carriers. According to such a structure, a high electric field in the vicinity of a drain is alleviated, thereby it becomes possible to prevent on-current from decreasing due to hot carriers. Note that the LDD region of the portion that does not overlap the gate electrode with the gate insulating film interposed therebetween is referred to as a Loff region while the LDD region of the portion that overlaps the gate electrode with the gate insulating film interposed therebetween is referred to as a Lov region.

Here, the Loff region works effectively in suppressing off-current whereas it does not work effectively in preventing on-current from decreasing due to hot carriers by alleviating the electric field in the vicinity of the drain. On the other hand, the Lov region works effectively in preventing on-current from decreasing by alleviating the electric field in the vicinity of the drain, however, it does not work effectively in suppressing off-current. Accordingly, TFTs having appropriate TFT characteristics for each of the various circuits are required to be formed.

However, manufacture of TFTs corresponding to the function of each of the various circuits makes structures thereof complex, which involves a larger number of manufacturing steps. Such an increase in the number of the manufacturing steps leads to a higher manufacturing cost and a lower manufacturing yield.

SUMMARY OF THE INVENTION

In order to solve the foregoing problems, the invention provides a semiconductor device typified by an active matrix display device manufactured by using TFTs where TFTs disposed in each circuit have appropriate structures for the function of the circuit in order to improve the operating characteristics and reliability of the semiconductor device as well as to reduce the number of manufacturing steps with the purpose of reduction in manufacturing cost and improvement of the yield.

According to the invention, a conductive film to be a gate electrode is formed over an island-like semiconductor film with a gate insulating film interposed therebetween, and a tapered resist is formed over the conductive film. By etching the conductive film simultaneously with the resist, a tapered gate electrode is formed. At this time, the resist is also etched to be reduced. Then, impurities are doped at a high concentration using the tapered gate electrode as a mask, thereby forming a source region and a drain region. After that, the tapered gate electrode is etched in the perpendicular direction using as a mask the resist that is provided for forming the tapered gate electrode. In this manner, a gate electrode of which tapered portion is removed by etching can be formed. Then, impurities are doped at a low concentration to the semiconductor layer using the gate electrode as a mask, thereby forming a LDD region.

In addition, a fine TFT having a Lov region or a Loff region, or both Lov and Loff regions can be obtained by forming a LDD region through the steps of: dry etching a gate electrode a plurality of times; depositing a silicon oxide film or a silicon nitride film to be a sidewall; forming a sidewall by dry etching the silicon oxide film or the silicon nitride film by etch back, and doping impurities to the semiconductor layer a plurality of times.

A first structure of the invention is a manufacturing method of a semiconductor device which comprises: a first step of forming a gate insulating film over an island-like semiconductor layer; a second step of forming a first conductive film to be a first gate electrode over the gate insulating film; a third step of forming a second conductive film to be a second gate electrode over the first conductive film; a fourth step of forming a tapered resist over the second conductive film; a fifth step of forming the second gate electrode to have a tapered shape by etching the resist and the second conductive film; a sixth step of doping an impurity element of one conductivity type to the semiconductor layer; a seventh step of etching the second gate electrode perpendicularly using the resist as a mask; an eighth step of doping the impurity element of one conductivity type to the semiconductor layer; a ninth step of removing the resist; a tenth step of forming a silicon compound film over the second gate electrode; an eleventh step of forming sidewalls on opposite sides of the second gate electrode by etching the silicon compound film; and a twelfth of for forming the first gate electrode by etching the first conductive film using the second gate electrode and the sidewall as a mask, wherein the impurity element of one conductivity type doped in the eighth step have a lower concentration than the impurity element of one conductivity type doped in the sixth step.

When manufacturing a semiconductor device by using such a manufacturing method, a Lov region that overlaps a gate electrode of a thin film transistor, and a Loff region that does not overlap the gate electrode of the thin film transistor are each formed in a low concentration impurity region (Lightly Doped Drain region: hereinafter also referred to as a LDD region) of a semiconductor layer. The Lov region has a so-called GOLD structure.

A second structure of the invention is a manufacturing method of a semiconductor device which comprises: a first step of forming a gate insulating film over an island-like semiconductor layer; a second step of forming a first conductive film to be a first gate electrode over the gate insulating film; a third step of forming a second conductive film to be a second gate electrode over the first conductive film; a fourth step of forming a tapered resist over the second conductive film; a fifth step of forming the second gate electrode to have a tapered shape by etching the resist and the second conductive film; a sixth step of doping an impurity element of one conductivity type to the semiconductor layer; a seventh step of etching the second gate electrode perpendicularly using the resist as a mask; an eighth step of removing the resist; a ninth step of doping the impurity element of one conductivity type to the semiconductor layer; a tenth step of forming a silicon compound film over the second gate electrode; an eleventh step of forming sidewalls on opposite sides of the second gate electrode by etching the silicon compound film; and a twelfth step of forming the first gate electrode by etching the first conductive film using the second gate electrode and the sidewall as a mask, wherein the impurity element of one conductivity type doped in the ninth step have a lower concentration than the impurity element of one conductivity type doped in the sixth step.

The above structure is different from the first structure in the order of the removing step of the tapered resist by etching. As in the first structure, a Lov region that overlaps a gate electrode of a thin film transistor, and a Loff region that does not overlap the gate electrode of the thin film transistor are each formed in a LDD region of a semiconductor layer. The Lov region has a so-called GOLD structure.

A third structure of the invention is a manufacturing method of a semiconductor device which comprises: a first step of forming a gate insulating film over an island-like semiconductor layer; a second step of forming a first conductive film to be a first gate electrode over the gate insulating film; a third step of forming a second conductive film to be a second gate electrode over the first conductive film; a fourth step of forming a tapered resist over the second conductive film; a fifth step of forming the first and second gate electrodes to have tapered shapes by etching the resist, the first conductive film and the second conductive film; a sixth step of doping an impurity element of one conductivity type to the semiconductor layer; a seventh step of etching the second gate electrode perpendicularly using the resist as a mask; an eighth step of doping the impurity element of one conductive type to the semiconductor layer; a ninth step of removing the resist; a tenth step of forming a silicon compound film over the second gate electrode; an eleventh step of forming sidewalls on opposite sides of the second gate electrode by etching the silicon compound film; and a twelfth step of etching the first gate electrode using the second gate electrode and the sidewall as a mask, wherein the impurity elements of one conductivity type doped in the eighth step have a lower concentration than the impurity elements of one conductivity type doped in the sixth step.

When manufacturing a semiconductor device by using such a manufacturing method, a Lov region that overlaps a gate electrode of a thin film transistor, and a Loff region that does not overlap the gate electrode of the thin film transistor are each formed in a LDD region of a semiconductor layer. The Lov region has a so-called GOLD structure.

A fourth structure of the invention is a manufacturing method of a semiconductor device which comprises: a first step of forming a gate insulating film over an island-like semiconductor layer; a second step of forming a first conductive film to be a first gate electrode over the gate insulating film; a third step of forming a second conductive film to be a second gate electrode over the first conductive film; a fourth step of forming a tapered resist over the second conductive film; a fifth step of forming the first and second gate electrodes to have tapered shapes by etching the resist, the first conductive film and the second conductive film; a sixth step of doping an impurity element of one conductivity type to the semiconductor layer; a seventh step of etching the second gate electrode perpendicularly using the resist as a mask; an eighth step of removing the resist; a ninth step of doping the impurity element of one conductivity type to the semiconductor layer; a tenth step of forming a silicon compound film over the second gate electrode; an eleventh step of forming sidewalls on opposite sides of the second gate electrode by etching the silicon compound film; and a twelfth step of etching the first gate electrode using the second gate electrode and the sidewall as a mask, wherein the impurity element of one conductivity type doped in the eighth step have a lower concentration than the impurity elements of one conductivity type doped in the sixth step.

The above structure is different from the third structure in the order of the removing step of a tapered resist by etching. As in the first structure, a Lov region that overlaps a gate electrode of a thin film transistor, and a Loff region that does not overlap the gate electrode of the thin film transistor are each formed in a LDD region of a semiconductor layer. The Lov region has a so-called GOLD structure.

A fifth structure of the invention is the manufacturing method of a semiconductor device according to the above structure, wherein a width of the sidewalls in a channel length direction is shorter than a width of the tapered portion of the second gate electrode in a channel length direction, which is etched perpendicularly in the seventh step.

A sixth structure of the invention is the manufacturing method of a semiconductor device according to the above structure, wherein the silicon compound film comprises a material elected from the group consisting of silicon oxide, silicon nitride and silicon oxynitride.

A seventh structure of the invention is a manufacturing method of a semiconductor device which comprises: a first step of forming a gate insulating film over an island-like semiconductor layer; a second step of forming a first conductive film to be a first gate electrode over the gate insulating film; a third step of forming a second conductive film to be a second gate electrode over the first conductive film; a fourth step of forming a tapered resist over the second conductive film; a fifth step of forming the first and second gate electrodes to have tapered shapes by etching the resist, the first conductive film and the second conductive film; a sixth step of doping an impurity element of one conductivity type to the semiconductor layer; a seventh step of etching the second gate electrode perpendicularly using the resist as a mask; and an eighth step of doping the impurity element of one conductivity type to the semiconductor layer, wherein the impurity element of one conductivity type doped in the eighth step have a lower concentration than the impurity elements of one conductivity type doped in the sixth step.

When manufacturing a semiconductor device by using such a manufacturing method, a Loff region that does not overlap a gate electrode of a thin film transistor is formed in a LDD region of a semiconductor layer.

A eighth structure of the invention is a manufacturing method of a semiconductor device which comprises: a first step of forming a gate insulating film over an island-like semiconductor layer; a second step of forming a conductive film to be a gate electrode over the gate insulating film; a third step of forming a tapered resist over the conductive film; a fourth step of forming the f gate electrode to have a tapered shape by etching the resist and the conductive film; a fifth step of doping an impurity element of one conductivity type to the semiconductor layer; a sixth step of etching the gate electrode perpendicularly using the resist as a mask; and a seventh step of doping the impurity element of one conductivity type to the semiconductor layer, wherein the impurity element of one conductivity type doped in the eighth step have a lower concentration than the impurity element of one conductivity type doped in the sixth step.

When manufacturing a semiconductor device by using such a manufacturing method, a Lov region that overlaps a gate electrode of a thin film transistor is formed in a LDD region of a semiconductor layer, and the Lov region has a so-called GOLD structure. Further, the gate electrode has a laminated structure which includes at least two conductive layers.

A semiconductor device of the invention comprises: a source region, a drain region and a channel region formed over a substrate having an insulating surface; an inland-like semiconductor layer including an impurity region of which impurity concentration is lower than that of the source and drain regions, which is formed between the channel region and each of the source and the drain region; a gate insulating film formed over the island-like semiconductor layer; a first gate electrode formed over the gate insulating film; a second gate electrode of which channel length direction is shorter than that of the first gate electrode; and sidewalls formed of a silicon compound film located on opposite sides of the second gate electrode in the channel length direction, wherein the first gate electrode partially overlaps the low concentration impurity region with the gate insulating film interposed therebetween; and the length of the first gate electrode that overlaps the low concentration impurity region is equal to the length of the sidewall.

Note that the semiconductor device herein includes a liquid crystal display device, a display device where an electroluminescence light emitting element is connected to a TFT (hereinafter also referred to as an EL display device) and the like.

According to the invention, a semiconductor device where a plurality of functional circuits are formed over the same substrate can be provided, in which TFTs are formed correspondingly to the function of each circuit. In addition, when manufacturing a thin film transistor having a Lov region or a Loff region, no additional resist mask is required, therefore, the number of the manufacturing steps can be reduced, which leads to improvement of the yield and reduction in the manufacturing cost.

Further, according to the invention, etching is performed in the perpendicular direction using a resist mask that is used for the manufacture of a tapered gate electrode, therefore, a LDD region can be formed with accuracy in the semiconductor layer located under the tapered portion of the gate electrode that is removed by etching.

BRIEF DESCRIPTION OF THE DRAWINGS

FIGS. 8A to 8C are diagrams illustrating a manufacturing method of a display device according to Embodiment Mode 6.

FIGS. 9A to 9C are diagrams illustrating a manufacturing method of a display device according to Embodiment Mode 6.

DETAILED DESCRIPTION OF THE PREFERRED EMBODIMENTS

Figure 1A:
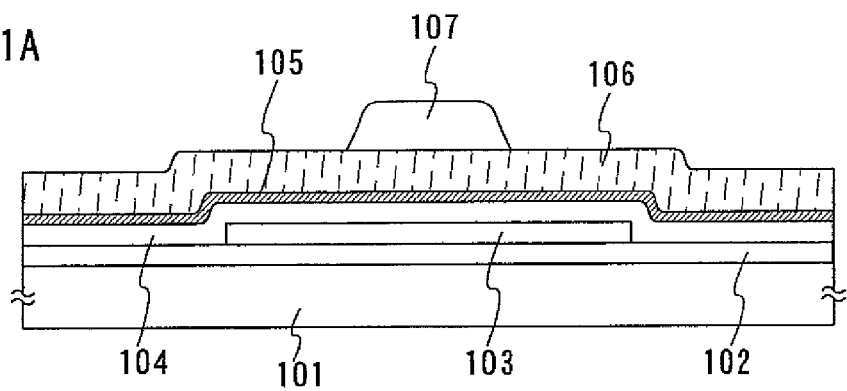
FIGS. 1A to 1D are diagrams illustrating a manufacturing method of a semiconductor device according to Embodiment Mode 1 and Embodiment 1.

Although the invention will be fully described by way of Embodiment Modes and Embodiments with reference to the accompanying drawings, it is to be understood that various changes and modifications will be apparent to those skilled in the art. Therefore, unless otherwise such changes and modifications depart from the scope of the invention, they should be construed as being included therein.

Embodiment Mode 1

Description is made below with reference to FIGS. 1A to 1D and 2A to 2C. Note that a thin film transistor used in a semiconductor device manufactured in this embodiment mode has a Lov region that overlaps a gate electrode, and a Loff region that that does not overlap the gate electrode, each of which is formed in a LDD region of a semiconductor layer.

First, a base insulating film 102 is formed over a substrate 101 with a thickness of 100 to 300 nm. The substrate may be an insulating substrate such as a glass substrate, a quartz substrate, a plastic substrate and a ceramic substrate, a metal substrate, a semiconductor substrate and the like.

The base insulating film can be formed by CVD or sputtering. For example, it may be formed of a silicon oxide film, a silicon nitride film, a silicon oxynitride film and the like formed by CVD using materials such as $SiH_4$, $N_2O$ and $NH_3$. Alternatively, they may be used in lamination. Note that the base insulating film is provided in order to prevent that impurities are diffused from the substrate to the semiconductor layer, and when the substrate is formed of a glass substrate or a quartz substrate, the base insulating film is not required.

Next, a semiconductor layer is formed with a thickness of 10 to 100 nm. The material of the semiconductor layer can be selected according to the required characteristics of a TFT, and any of a silicon film, a germanium film and a silicon germanium film may be used as the semiconductor layer. However, it is preferable to use an amorphous semiconductor formed by CVD or sputtering, which is then crystallized by thermal annealing using an electric heater or laser annealing using an excimer laser. Alternatively, rapid thermal annealing (RTA) using a halogen lamp can be used. Further, what is called a micro-crystal semiconductor (μc-Si:H) that can be formed by CVD may also be used. This semiconductor layer is patterned to form an island-like semiconductor layer 103.

Here, when the base insulating film 102 and the semiconductor film 103 are both formed by plasma CVD, they may be formed continuously in vacuum. After the formation of the base insulating film, the surface thereof is not exposed to the atmospheric air, therefore, it can be protected from contamination, which can reduce characteristic variations of TFTs to be formed.

Subsequently, a gate insulating film 104 is formed covering the island-like semiconductor layer 103 with a thickness of 10 to 200 nm. The gate insulating film 104 may be formed of a silicon oxide film, a silicon nitride film, a silicon oxynitride film and the like formed by CVD or sputtering. By forming the gate insulating film thin, a TFT capable of high-speed operation can be obtained, however, when it is formed extremely thin, leak current is increased, which leads to inferior TFT characteristics. The gate insulating film is preferably formed with a thickness of 50 to 150 nm.

Subsequently, a first conductive film 105 and a second conductive film 106 to become a gate electrode are formed over the gate insulating film 104. First, the first conductive film 105 is formed with a thickness of 5 to 50 nm. The first conductive film 105 can be formed of an aluminum (Al) film, a copper (Cu) film, a thin film containing aluminum or copper as its main component, a chromium (Cr) film, a tantalum (Ta) film, a tantalum nitride (TaN) film, a titanium (Ti) film, a tungsten (W) film, a molybdenum film and the like. Over the first conductive film 105, the second conductive film 106 is formed with a thickness of 150 to 500 nm. The second conductive film 106 is preferably formed by using a material that facilitates the etching into a tapered shape in the subsequent step. For example, it is formed of a chromium (Cr) film, a tantalum (Ta) film, a titanium (Ti) film, a tungsten (W) film, an aluminum (Al) film, a film containing tantalum as its main component and the like. Note that the combination of the first conductive film 105 and the second conductive film 106 has to be selected on the condition that each of them can be etched at a certain selection ratio. As a combination of the first conductive film and the second conductive film that can be etched at a certain selection ratio, for example, a combination of Al and Ta, a combination of Al and Ti, or a combination of TaN and W can be used. In addition, in this embodiment mode, the gate electrode is formed in two-layer structure, and doping is performed in the subsequent step by doping impurity elements through the gate insulating film 104 and the first conductive film 105, therefore, the first conductive film 105 is preferably formed thin enough to transmit impurity elements easily.

Subsequently, a tapered resist 107 is formed as a mask over the second conductive film by photolithography using a photo mask (see FIG. 1). The tapered resist 107 can be formed by a known method.

Subsequently, the first dry etching is performed (see FIG. 1B). In the first dry etching, the tapered resist 107 and the second conductive film 106 are etched at a low selection ratio, whereby the tapered resist 107 and the second conductive film 106 are etched to form a second gate electrode 108. At this time, etching is preferably performed at a high selection ratio relatively to the first conductive film 105 so that it is hardly etched. Note that the resist 107 is also etched to form a resist 109.

The dry etching in this embodiment mode can be performed by using ICP (Inductively Coupled Plasma) etching.

Subsequently, the first doping is performed with the condition that the first conductive film 105 and the gate insulating film 104 transmit impurity elements, thereby forming source and drain regions 110 in the semiconductor layer 103 (see FIG. 1C). The doping may be performed by using ion doping or ion implantation. As for the impurity elements, for example, boron (B), gallium (Ga) or the like is used when forming a P-type semiconductor while phosphorus (P), arsenic (As) or the like is used when forming an N-type semiconductor. In the first doping, impurity elements are doped into the semiconductor layer 103 at a concentration of $1\times10^{20}$ to $1\times10^{21}$ atoms/cm$^3$.

Subsequently, the second dry etching is performed. The second gate electrode 108 is etched perpendicularly in accordance with the width of the resist 109, thereby forming a second gate electrode 112 (see FIG. 1D). At this time, only a tapered portion 111 of the second gate electrode is etched at a high selection ratio relatively to the first conductive film 105. Accordingly, a taper width L1 of the semiconductor layer, which has been covered with the tapered portion 111, is exposed through the gate insulating film 104. That is, regardless of whether the first doping is performed or not, the region doped with a slight amount of impurities ($1\times10^{16}$ atoms/cm$^3$ or less) that has penetrated the tapered portion of the second gate electrode is exposed. To be exposed herein means that a portion to be a mask is removed, and does not necessarily mean that the semiconductor layer is exposed.

Figure 2A:
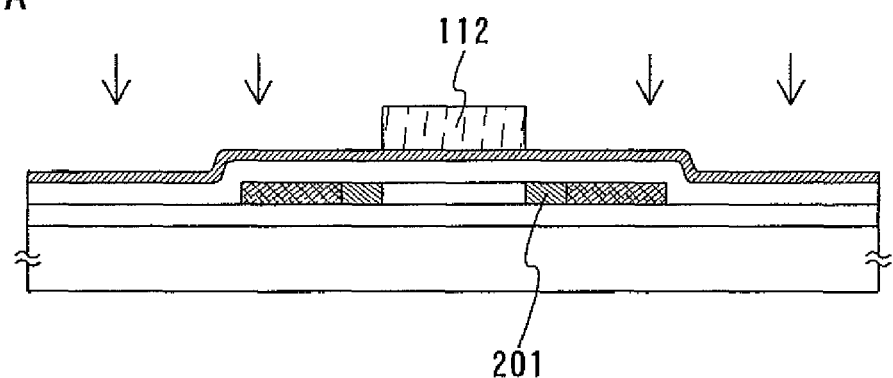
FIGS. 2A to 2C are diagrams illustrating a manufacturing method of a semiconductor device according to Embodiment Mode 1 and Embodiment 1.

Subsequently, the second doping is performed after removing the resist 109 over the second gate electrode 112 (see FIG. 2A). The second doping is performed by using impurities of the same conductivity type as the dopant used in the first doping with the condition that the impurities can be doped into the semiconductor layer 103 through the gate insulating film 104 and the first conductive film 105. According to the second doping, a low concentration impurity region (Lightly Doped Drain region: hereinafter referred to as a LDD region) 201 is formed in the region that is exposed by the second etching, to which the first doping is not performed. At this time, concentration of the impurity elements in the LDD region 201 is $1\times10^{16}$ to $1\times10^{20}$ atoms/cm$^3$ (preferably, $1\times10^{16}$ to $5\times10^{18}$ atoms/cm$^3$). Note that the source region and the drain region are also doped by the second doping, however, it has few effect as the dosage of the second doping is a slight amount as compared to that of the first doping. Note that the resist 109 may be removed after the second doping as well.

Figure 2B:
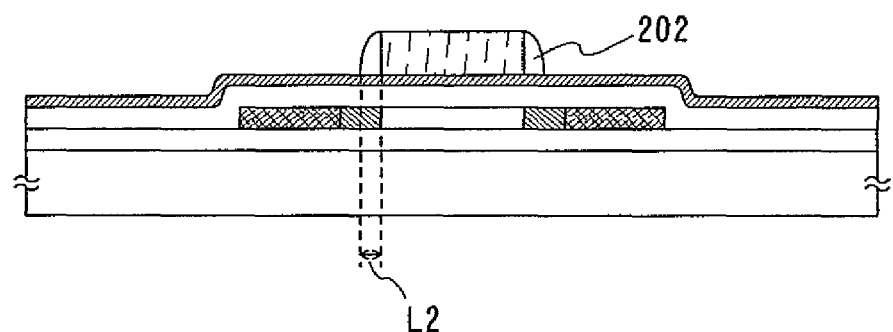

Subsequently, a silicon compound film such as a silicon oxide film, a silicon nitride film and a silicon oxynitride film is formed covering the first conductive film 105 and the second gate electrode 112, and the third dry etching is performed by etch back (see FIG. 2B). Accordingly, a sidewall 202 formed of a silicon oxide film, a silicon nitride film or a silicon oxynitride film is formed on opposite sides of the second gate electrode 108. A width L2 of the sidewall 202 differs depending on the thickness of the silicon oxide film, the silicon nitride film or the silicon oxynitride film.

Figure 2C:
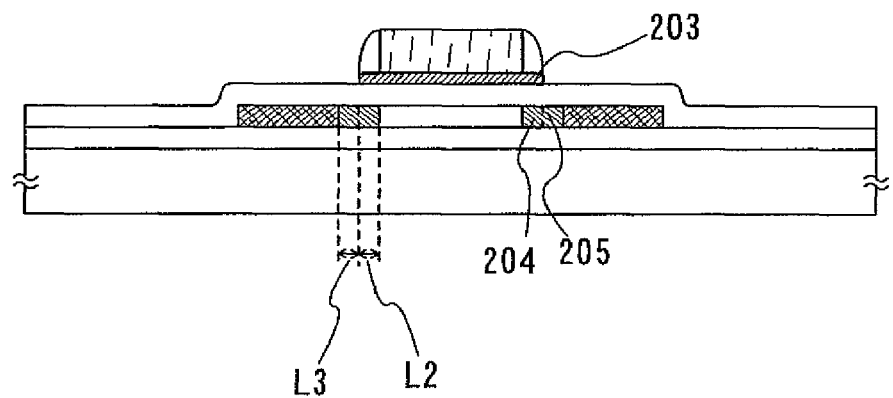

Subsequently, the fourth dry etching is performed using the sidewall 202 and the second gate electrode 112 as masks, thereby forming a first gate electrode 203 (see FIG. 2C). At this time, a Lov region 204 having a width of L2, which overlaps the first gate electrode 203 located outside the second gate electrode 112, and a Loff region 205 having a width of L3, which does not overlap the first gate electrode 203 are each formed in the LDD region. When the formation of the sidewall 202 and etching of the first conductive film 105 can be performed simultaneously by the third dry etching, the fourth dry etching can be omitted.

That is, the width L2 of the Lov region 204 in the channel length direction (Lov length) and the width L3 of the Loff region 205 in the channel length direction (Loff length) are determined by the width L1 of the low concentration impurity region in the channel length direction that is determined by the first dry etching and the second dry etching, and by the width L2 of the sidewall in the channel length direction that is formed by the third etching. In this process, it is necessary that L1>L2 is satisfied.

By forming the Lov region 204 having a GOLD (Gate Overlapped LDD) structure, a highly reliable TFT can be obtained. Further, by forming the Loff region 205, off-current can be decreased, which leads to even higher performance.

In the case of etching the resist and the gate electrode to serve as doping masks in the lateral direction in order to form a LDD region, for example, it is difficult to evaluate the etching rate in the lateral direction. Therefore, a stable process cannot be established. However, as described in this embodiment mode, by using a tapered resist to form a tapered gate electrode, and etching perpendicularly the tapered portion of the gate electrode using the resist instead of using an additional resist, it becomes possible to form a LDD region with high controllability, thereby establishing a stable process. In particular, this embodiment mode is suitable for the manufacture of a semiconductor device comprising fine TFTs (fine TFTs formed by using a stepper in the photolithography step).

In this manner, a semiconductor device comprising a circuit including the thin film transistors of the invention can be manufactured.

Embodiment Mode 2

In this embodiment mode, description is made with reference to FIGS. 3A to 3D on the manufacturing method of a semiconductor device comprising a circuit including a thin film transistor provided with a Lov region that overlaps a first gate electrode, which is formed in a LDD region.

Using a similar method to that in Embodiment Mode 1, a base insulating film 302, a semiconductor layer 303, a gate insulating film 304, a first conductive film and a second conductive film are sequentially formed over a substrate 301, and further a tapered resist is formed thereon.

Subsequently, the first dry etching is performed. In the first dry etching in Embodiment Mode 2, the second conductive film is etched to have a tapered shape, and the first conductive film is etched simultaneously with the formation of a second gate electrode 306, thereby forming a tapered first gate electrode 305. At this time, the resist is also etched to form a resist 307.

The dry etching in this embodiment mode can be performed by using ICP (Inductively Coupled Plasma) etching.

Subsequently, the first doping is performed in which impurities are doped into the semiconductor layer to form source and drain regions 308 (see FIG. 3B). The doping is performed so that impurity elements are doped at a concentration of $1\times10^{20}$ to $1\times10^{21}$ atoms/cm$^3$. In Embodiment Mode 1, the first doping is performed through the first conductive film 105, however, in this embodiment mode, doping can be performed without the first gate electrode 305. Therefore, impurities can be doped at a high concentration easily in the formation of the source and drain regions.

Subsequently, the second dry etching is performed using the resist 307 as a mask. The second gate electrode 306 is etched in the perpendicular direction at a high selection ratio so that the first gate electrode 305 is not etched. According to the second etching, the tapered portion of the second gate electrode 306 is etched (see FIG. 3C).

Subsequently, the second doping is performed as in Embodiment Mode 1 (see FIG. 3D). Doping is performed through the first gate electrode and the gate insulating film, thereby forming a LDD region 309 in the semiconductor layer of the region overlapping the first gate electrode. Impurity elements are doped into the LDD region 309 at a concentration of $1\times10^{16}$ to $1\times10^{20}$ atoms/cm$^3$ (preferably, $1\times10^{16}$ to $5\times10^{18}$ atoms/cm$^3$). Note that in the LDD region 309, the concentration of the impurity elements is higher in the vicinity of the source and drain regions as for the region under the tapered portion of the first gate electrode 305. Note also that the resist 307 may be removed either before or after the second doping.

In this embodiment mode, a GOLD structure is obtained where a Lov region that overlaps the first gate electrode is formed in the LDD region. A TFT having the GOLD structure can provide high reliability.

In the case of etching the resist and the gate electrode to serve as doping masks in the lateral direction in order to form a LDD region, for example, it is difficult to evaluate the etching rate in the lateral direction. Therefore, a stable process cannot be established. However, as described in this embodiment mode, by using a tapered resist to form a tapered gate electrode, and etching perpendicularly the tapered portion of the gate electrode using the resist instead of using an additional resist, it becomes possible to form a LDD region with high controllability, thereby establishing a stable process. In particular, this embodiment mode is suitable for the manufacture of a semiconductor device comprising fine TFTs (fine TFTs formed by using a stepper in the photolithography step).

Embodiment Mode 3

In this embodiment mode, description is made with reference to FIGS. 3A to 3D and FIGS. 4A and 4B on the manufacturing method of a semiconductor device comprising a circuit including a thin film transistor provided with a Lov region that overlaps the first gate electrode, and a Loff region that does not overlap the first gate electrode, each of which is formed in the LDD region. Note that common portions to those in FIGS. 3A to 3D are denoted by common reference numerals.

Figure 3A:
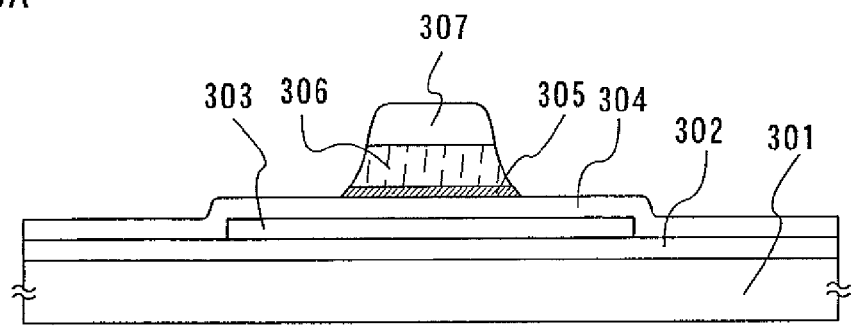
FIGS. 3A to 3D are diagrams illustrating a manufacturing method of a semiconductor device according to Embodiment Mode 2.
Figure 3B:
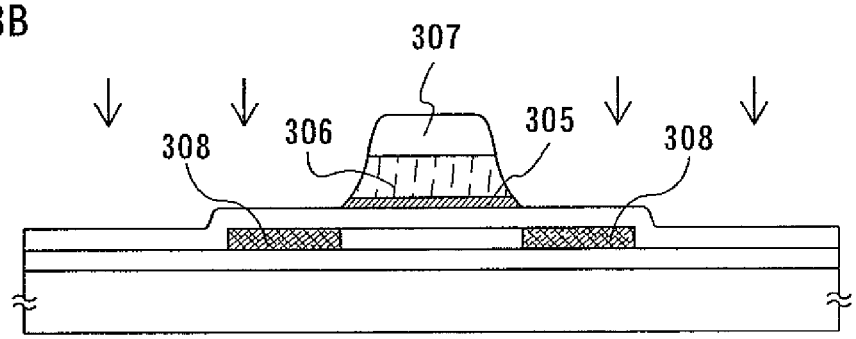
Figure 3C:
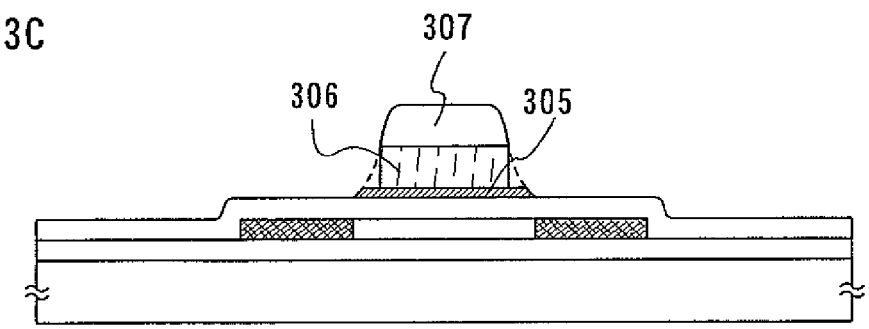
Figure 3D:
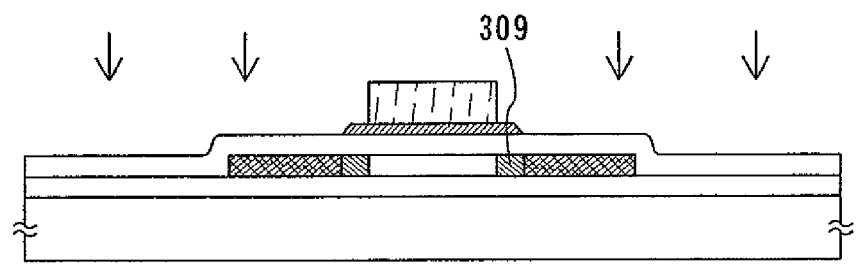

Using a similar method to that in Embodiment Mode 2, the state in FIG. 3D is obtained. The steps heretofore can be carried out using a similar method to that in Embodiment Mode 1, however, in this embodiment mode, a Loff region that does not overlap the first gate electrode 305 is formed in the LDD region.

Figure 4A:
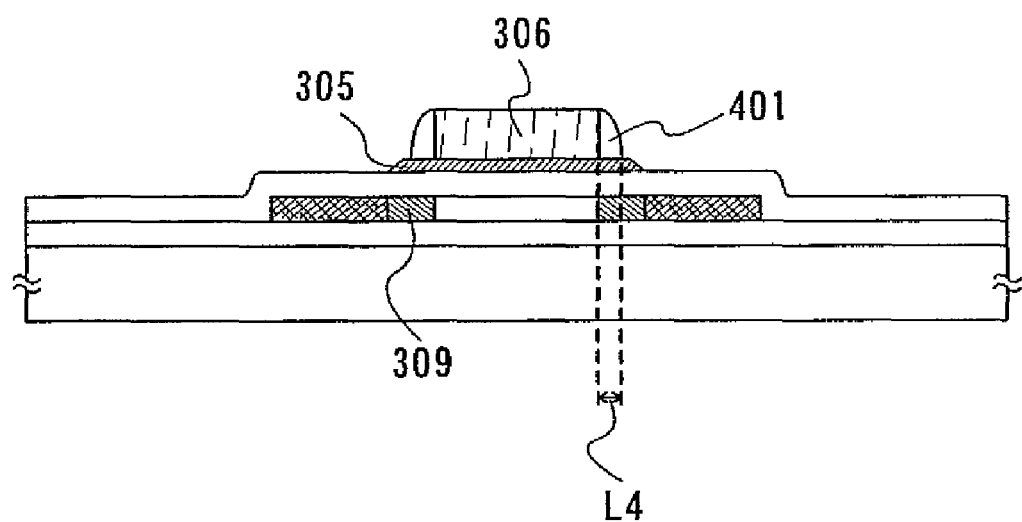
FIGS. 4A and 4B are diagrams illustrating a manufacturing method of a semiconductor device according to Embodiment Mode 3.

Subsequently, as described in Embodiment Mode 1, a silicon compound film such as a silicon oxide film, a silicon nitride film and a silicon oxynitride film is formed covering the first gate electrode 305 and the second gate electrode 306, and the third dry etching is performed by etch back (see FIG. 4A). Accordingly, a sidewall 401 formed of a silicon oxide film, a silicon nitride film or a silicon oxynitride film is formed on opposite sides of the second gate electrode 306. A width L4 of the sidewall 401 in the channel length direction is formed narrower than the width of the LDD region 309.

The dry etching in this embodiment mode can be performed by using ICP (Inductively Coupled Plasma) etching.

Figure 4B:
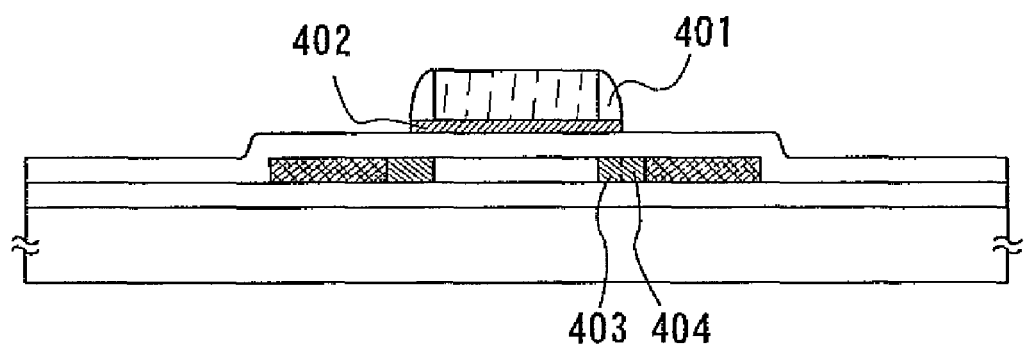

Subsequently, the fourth dry etching is performed to the gate electrode 305 using the sidewall 401 and the second gate electrode 306 as masks, thereby forming a first gate electrode 402 (see FIG. 4B). At this time, a Lov region 403 that overlaps the first gate electrode 402, and a Loff region 404 that does not overlap the first gate electrode 402 are each formed in the LDD region 309. By forming the Lov region 403 having a GOLD (Gate Overlapped LDD) structure, a highly reliable TFT can be obtained. Further, by forming the Loff region 404, off-current can be decreased, which leads to even higher performance. When the formation of the sidewall 401 and etching of the first gate electrode 305 can be performed simultaneously by the third dry etching, the fourth dry etching can be omitted.

In the case of etching the resist and the gate electrode to serve as doping masks in the lateral direction in order to form a LDD region, for example, it is difficult to evaluate the etching rate in the lateral direction. Therefore, a stable process cannot be established. However, as described in this embodiment mode, by using a tapered resist to form a tapered gate electrode, and etching perpendicularly the tapered portion of the gate electrode using the resist instead of using an additional resist, it becomes possible to form a LDD region with high controllability, thereby establishing a stable process. In particular, this embodiment mode is suitable for the manufacture of a semiconductor device comprising fine TFTs (fine TFTs formed by using a stepper in the photolithography step).

Embodiment Mode 4

In this embodiment mode, description is made with reference to FIGS. 3A and 3B and FIGS. 5A and 5B on the manufacturing method of a semiconductor device comprising a circuit including a thin film transistor provided with a Loff region that does not overlap a first gate electrode, which is formed in a LDD region. Note that common portions to those in FIGS. 3A to 3B are denoted by common reference numerals.

Figure 5A:
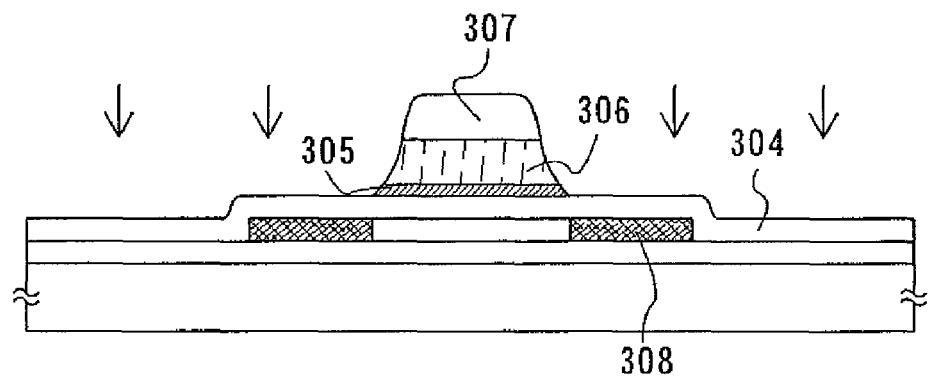
FIGS. 5A and 5B are diagrams illustrating a manufacturing method of a semiconductor device according to Embodiment mode 4.

Using the steps up to FIG. 3B described in Embodiment Mode 2, the state in FIG. 5A is obtained.

Figure 5B:
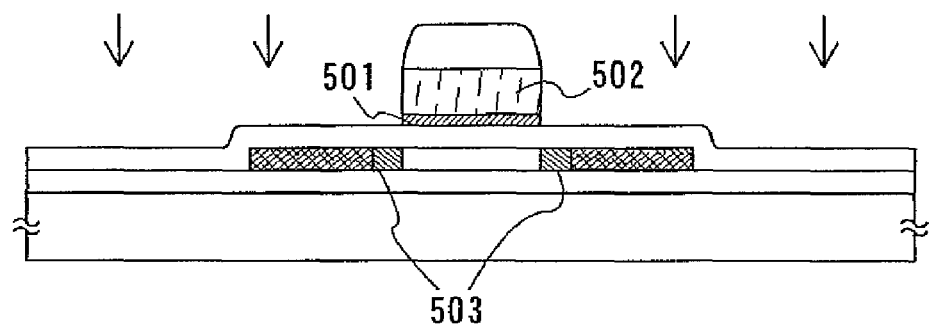

Subsequently, the second dry etching is performed using the resist 307 as a mask (see FIG. 5B). The first gate electrode 305 and the second gate electrode 306 are etched in the perpendicular direction. According to the second etching, tapered portions of the first gate electrode 305 and the second gate electrode 306 are removed. Thus, the first gate electrode 501 and the second gate electrode 502 whose tapered portions are removed is obtained.

The dry etching in this embodiment mode can be performed by using ICP (Inductively Coupled Plasma) etching.

In this embodiment mode, the gate electrode has a two-layer structure, however, the invention is not limited to the this, and a gate electrode having a single layer may be formed.

Subsequently, the second doping is performed as in Embodiment Mode 1. Doping is performed through the gate insulating film 304, and LDD regions 503 are formed in the semiconductor layer 303 of the region that does not overlap the first gate electrode 501. The concentration of the impurity elements in the LDD region 503 is set at $1\times10^{16}$ to $1\times10^{20}$ atoms/cm$^3$ (preferably, $1\times10^{16}$ to $5\times10^{18}$ atoms/cm$^3$).

In this embodiment mode, a Loff region that does not overlap the first gate electrode is formed in the LDD region, whereby a semiconductor device having TFT characteristics with small off-current can be provided.

In the case of etching the resist and the gate electrode to serve as doping masks in the lateral direction in order to form a LDD region, for example, it is difficult to evaluate the etching rate in the lateral direction. Therefore, a stable process cannot be established. However, as described in this embodiment mode, by using a tapered resist to form a tapered gate electrode, and etching perpendicularly the tapered portion of the gate electrode using the resist instead of using an additional resist, it becomes possible to form a LDD region with high controllability, thereby establishing a stable process. In particular, this embodiment mode is suitable for the manufacture of a semiconductor device comprising fine TFTs (fine TFTs formed by using a stepper in the photolithography step).

Embodiment Mode 5

In this embodiment mode, description is made with reference to FIGS. 13A to 15B on the manufacturing method of an ID chip comprising a TFT having a Lov region or a Loff region, or a TFT having both Lov and Loff regions. Note that the ID chip herein means a semiconductor device having an antenna in addition to a semiconductor integrated circuit or a thin film integrated circuit, which reads out data by wireless and the like. The ID chip has a function to store data to be read out, what is called a function of an electronic tag.

First, a peeling layer 1302 is formed over a glass substrate 1301. The peeling layer may be a layer containing silicon as its main component such as amorphous silicon and polycrystalline silicon. Then, a base film 1303 is formed thereover. The base film 1303 may be formed of silicon oxide ($SiO_x$), silicon nitride ($SiN_x$) or silicon oxynitride ($SiO_xN_y$). On the base film 1303, island-like semiconductor layers 1304a to 1304c are formed. The island-like semiconductor layers 1304a to 1304c are obtained by depositing a semiconductor layer by CVD or sputtering, and then patterning it. After that, it is irradiated with laser light to be crystallized. Subsequently, a gate insulating film 1305 is formed covering the island-like semiconductor layers 1304a to 1304c. Then, a first conductive film 1306 to be a first gate electrode, and a second conductive film 1307 to be a second gate electrode are formed. The combination of the first conductive film and the second conductive film is determined on the condition that each of them can be etched at a certain selection ratio. As an exemplary combination of the first conductive film and the second conductive film, the first conductive film is formed of TaN while the second conductive film is formed of W. Then, tapered resists 1308a to 1308d are formed over the island-like semiconductor layers 1304a to 1304c, and over the second conductive film 1307 as well (see FIG. 13A).

Figure 13A:
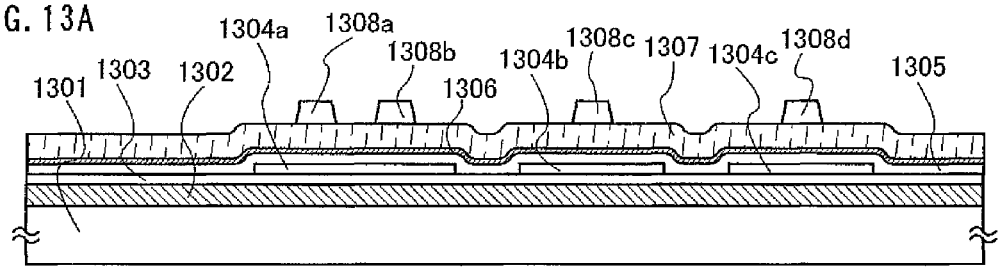
FIGS. 13A to 13D are diagrams illustrating a manufacturing method of an ID chip shown in Embodiment Mode 5.
Figure 13B:
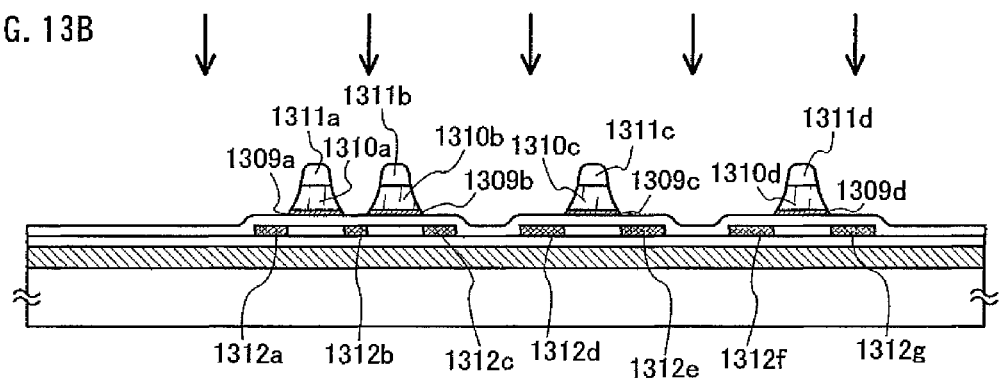
Figure 13C:
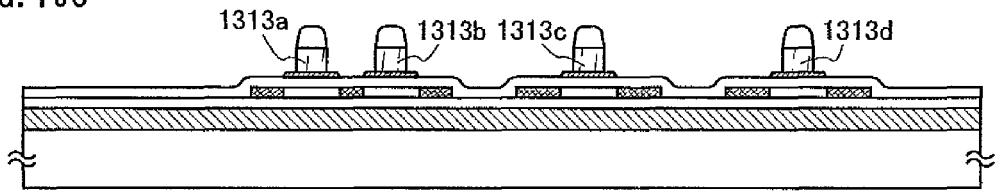
Figure 13D:
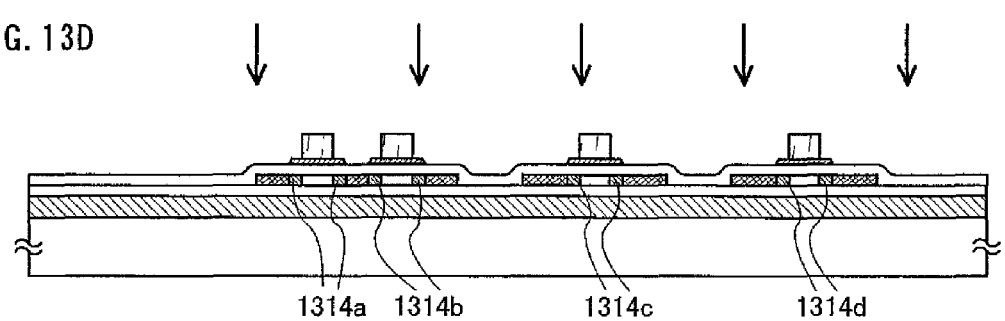

Subsequently, the first dry etching is performed (see FIG. 13B). In the first dry etching, the tapered resists 1308a to 1308d and the second conductive film 1307 are etched at a low selection ratio, whereby the tapered resists 1308a to 1308d, the second conductive film 1307 and the first conductive film 1306 are etched to form second gate electrodes 1310a to 1310d and first gate electrodes 1309a to 1309d. At this time, the resists 1308a to 1308d are also etched to form resists 1311a to 1311d.

The dry etching in this embodiment mode can be performed by using ICP (Inductively Coupled Plasma) etching.

Subsequently, the first doping is performed (see FIG. 13B). N-type impurity elements phosphorous in this embodiment mode) are doped so as to form impurity regions 1312a to 1312g containing a high concentration of phosphorous. Here, ion doping is performed using phosphin ($PH_3$), and the concentration of phosphorous in this region is controlled to be $1\times10^{20}$ to $1\times10^{21}$ atoms/cm$^3$ (typically, $2\times10^{20}$ to $5\times10^{20}$ atoms/cm$^3$).

Subsequently, the second dry etching is performed. Etching is performed in the perpendicular direction to the second gate electrodes 1310a to 1310d using the resists 1311a to 1311d as masks. Accordingly, second gate electrodes 1313a to 1313d are formed (see FIG. 13C).

Subsequently, the second doping is performed to the island-like semiconductor layers 1304a to 1304c. The second doping is performed to the semiconductor layer under the tapered portions of the second gate electrodes 1310a to 1310d that are removed in the previous second dry etching, which has not been subjected to the first doping, by using impurities of the same conductivity to the dopant used in the first doping (see FIG. 13C). That is, the semiconductor layer under the tapered portions of the second gate electrodes 1310a to 1310d become LDD regions 1314a to 1314d. At this time, the concentration of the impurity elements in the LDD regions 1314a to 1314d is set at $1\times10^{16}$ to $1\times10^{20}$ atoms/cm$^3$ (preferably, $1\times10^{16}$ to $5\times10^{18}$ atoms/cm$^3$). Note that the source region and the drain region are also doped in the second doping, however, it has few effect as the dosage of the second doping is smaller as compared to the dosage of the first doping. Note that the resists 1311a to 1311d may be removed after the second doping as well. Then, the semiconductor layer of the region where the first doping and the second doping are not performed, that is the semiconductor layer located below the resists 1311a to 1311d becomes a channel formation region.

Figure 14A:
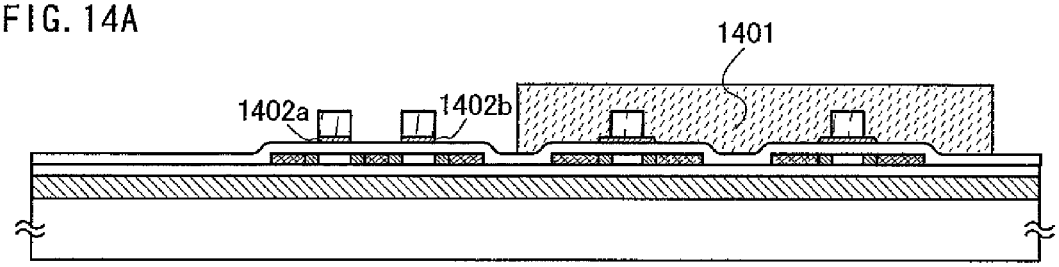
FIGS. 14A to 14D are diagrams illustrating a manufacturing method of an ID chip shown in Embodiment Mode 5.
Figure 14B:
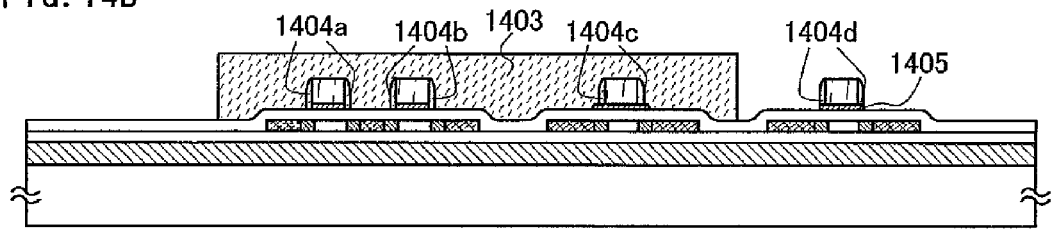

Subsequently, a resist 1401 is formed as shown in FIG. 14A. Then, the third dry etching is performed to the first gate electrodes 1309a and 1309b using the second gate electrodes 1313a and 1313b and the resist 1401 as masks. Then, the first gate electrode is formed into shapes of 1402a and 1402b.

Subsequently, the resist 1401 is removed, and a silicon oxide film is formed by CVD covering the second gate electrodes 1313a to 1313d. Then, the silicon oxide film is etched back by the fourth dry etching, and sidewalls 1404a to 1404d are formed on opposite sides of the second gate electrodes 1313a to 1313d. The sidewalls are formed over the LDD regions 1314a to 1314d. The sidewalls 1404a and 1404b are formed over the LDD regions 1314a and 1314b with the gate insulating film 1305 interposed therebetween respectively. The sidewalls 1404c and 1404d are formed over the LDD regions 1314c and the 1314d with the gate insulating film 1305, and the first gate electrodes 1309c and 1309d interposed therebetween.

Then, a resist 1403 is formed to perform the fifth dry etching using the resist 1403, the second gate electrode 1313d and the sidewall 1404d as masks. The first gate electrode 1309d is etched to form a first gate electrode 1405 (see FIG. 14B).

Figure 14C:
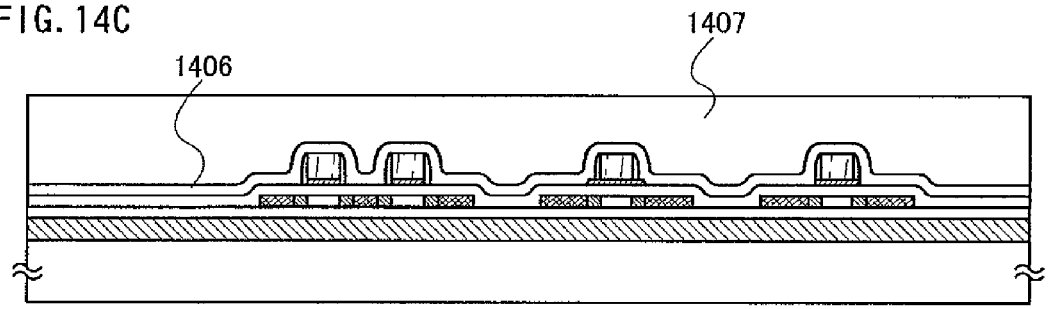

Then, as shown in FIG. 14C, a passivation film 1406 is formed, and a first interlayer insulating film 1407 is formed thereover. The passivation film 1406 may be formed of a silicon nitride film, a silicon oxynitride film or the like. The first interlayer insulating film 1407 may be formed of an organic resin film, an inorganic insulating film, and an insulating film formed of a siloxane resin. Siloxane resin is a resin having a Si—O—Si bond. Siloxane is composed of a skeleton formed by the bond of silicon (Si) and oxygen (O), in which an organic group containing at least hydrogen (such as an alkyl group or aromatic hydrocarbon) is included as a substituent. Alternatively, a fluoro group may be used as the substituent. Further alternatively, a fluoro group and an organic group containing at least hydrogen may be used as the substituent.

Figure 14D:
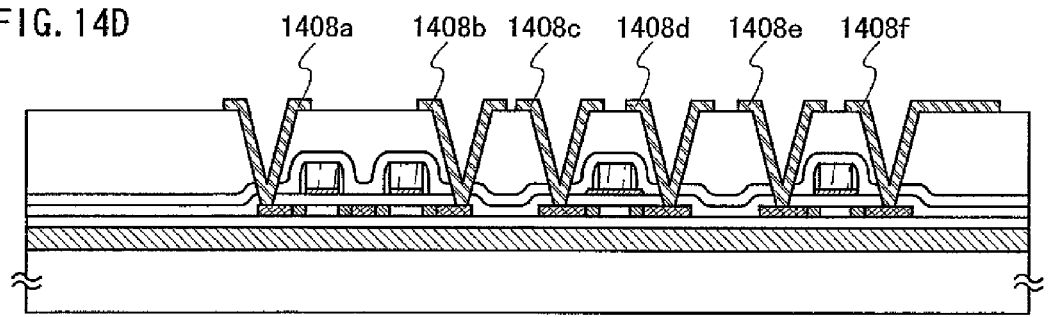

Subsequently, contact holes are formed in the first interlayer insulating film 1407, the passivation film 1406 and the gate insulating film 1305, and source and drain electrodes 1408a to 1408f are formed in contact with the impurity regions 1312a and 1312c to 1312g to serve as source and drain regions (see FIG. 14D).

Figure 15A:
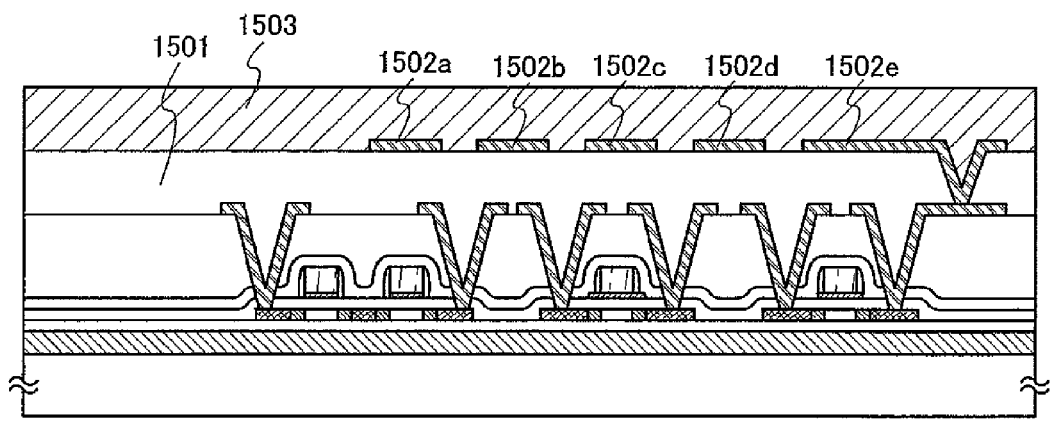
FIGS. 15A and 15B are diagrams illustrating a manufacturing method of an ID chip shown in Embodiment Mode 5.

Then, a second interlayer insulating film 1501 is formed over the first interlayer insulating film 1407 and the source and drain electrodes 1408a to 1408f. The second interlayer insulating film 1501 is formed with an opening in the position where a portion of the source and drain electrode is exposed. Then, antennas 1502a to 1502e are formed over the second interlayer insulating film. A portion of the antenna 1502e is formed to be in contact with the source and drain electrode in the opening. After that, a protective layer 1503 is formed over the antennas 1502a to 1502e and the second interlayer insulating film 1501 (FIG. 15A).

Figure 15B:
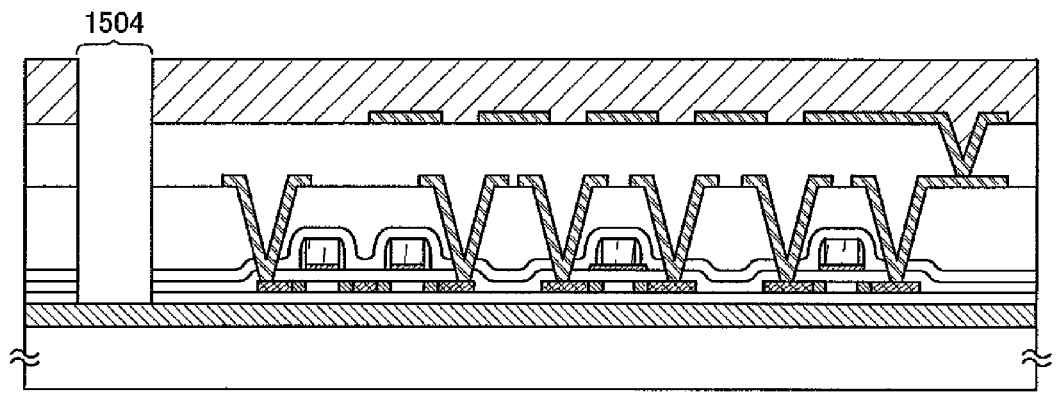

Subsequently, a trench 1504 is formed to isolate adjacent ID chips as shown in FIG. 15B. The trench 1504 is required to be deep enough to expose the peeling layer 1302. The trench 1504 may be formed by dicing, scribing and the like. Note that when there is no need to isolate the ID chips formed over the substrate 1301, the trench 1504 is not necessarily provided.

Figure 16A:
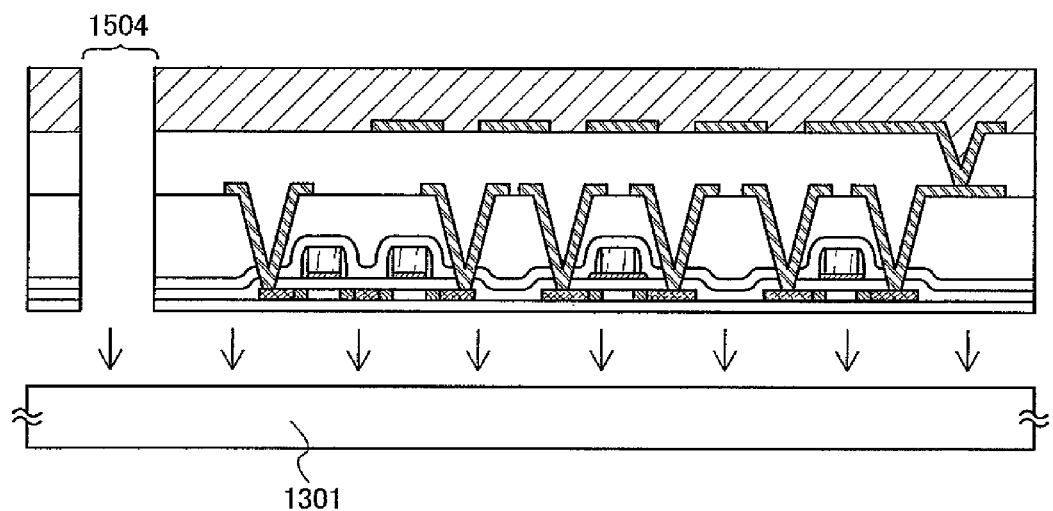
FIGS. 16A and 16B are diagrams illustrating a manufacturing method of an ID chip shown in Embodiment Mode 5.

Then, as shown in FIG. 16A, the peeling layer 1302 is removed by etching. In this manner, the substrate 1301 is peeled off. In this embodiment mode, a fluorine halide gas is used as an etching gas, which is injected through the trench 1504. However, other gas such as $ClF_3$ and a mixed gas of $ClF_3$ with nitrogen may be used, for example.

Figure 16B:
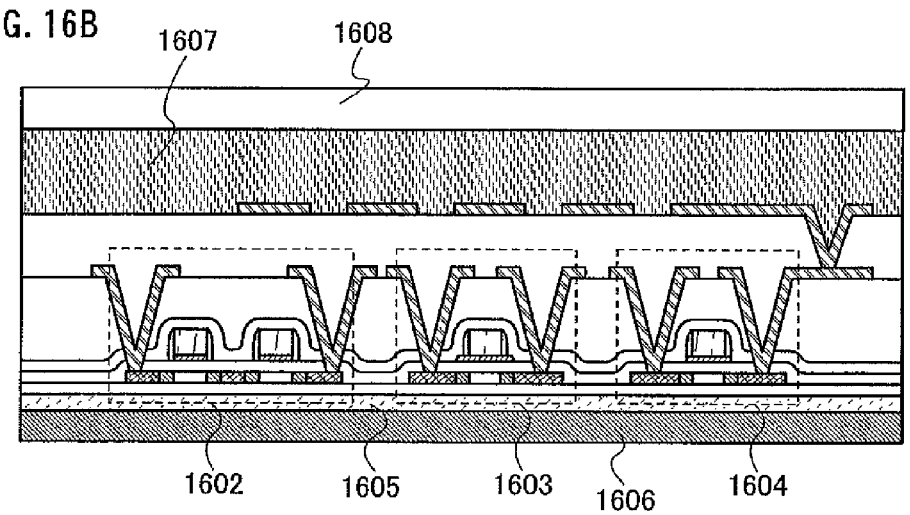

Subsequently, as shown in FIG. 16B, TFTs 1602 to 1604 and the antennas 1502a to 1502e are stuck to a support base 1606 using an adhesive 1605. The adhesive 1605 is formed of a material that is capable of sticking the support base 1606 and the base film 1303 to each other. The adhesive 1605 may be a curable adhesive of various types such as a reactive curable adhesive, a heat curable adhesive, an optical curable adhesive such as an ultraviolet light curable adhesive, and an anaerobic adhesive. The support base 1606 may be formed of an organic material such as paper and plastic that are flexible.

Then, after removing the protective film 1503 as shown in FIG. 16B, the adhesive 1607 is applied over the second interlayer insulating film 1501 so as to cover the antennas 1502a to 1502e, thereby sticking a covering material 1608 thereto. The covering material 1608 may be formed of an organic material such as paper and plastic that are flexible similarly to the support base 1606. The adhesive 1607 is formed of a material that is capable of sticking the covering material 1608 and the second interlayer insulating film 1501 to each other. The adhesive 1607 may be a curable adhesive of various types such as a reactive curable adhesive, a heat curable adhesive, an optical curable adhesive such as an ultraviolet light curable adhesive, and an anaerobic adhesive.

Through the aforementioned steps, an ID chip is completed. Note that this embodiment mode is not limited to the manufacturing method. ID chip comprising a TFT that has only a Lov region or a Loff region, or a TFT that has both Lov and Loff regions may be manufactured as well. Such ID chips can be manufactured by appropriately combining this embodiment mode with Embodiment Modes 1 to 4.

TFTs used in the ID chip require fine processing, therefore, they are preferably formed by a photolithography step using a stepper. However, when using a stepper, the LDD region is formed by using a resist mask, which involves a larger number of masks necessary for the whole steps. Thus, it leads to a higher manufacturing cost. In addition, when using a fine pattern, a margin of the patterning becomes small. For example, in the case of forming a Lov region with 0.5 µm at one side of the gate electrode of 2 µm by using a mask, an alignment accuracy of 0.1 µm or less is required. When performing isotropic etching to the gate electrode, optimization of the etching time is difficult to achieve. Specifically, it is impossible to inspect the amount etched in the lateral direction from the edge of the mask. That is, the end point of the etching cannot be inspected, which is thus difficult to evaluate the etching rate in the lateral direction. Unstable etching rate in the lateral direction hinders the establishment of a stable process.

Thus, the invention is suitable for the manufacture of a semiconductor device comprising TFTs that require fine processing, particularly such as an ID chip, a CPU, a flash memory, and a display device integrated with an audio signal processing circuit. In the manufacture of such semiconductor devices, TFTs having the desired structure can be obtained while achieving the reduction in manufacturing cost and improvement of the yield.

Embodiment Mode 6

In this embodiment mode, description is made with reference to FIGS. 7A to 10C on the manufacturing method of a display device. According to the manufacturing method of a display device described in this embodiment mode, TFTs of a pixel portion and its peripheral driver circuit portion are formed simultaneously. Note that a CMOS circuit is taken as an example of a basic unit of the driver circuit for simplicity.

Figure 7A:
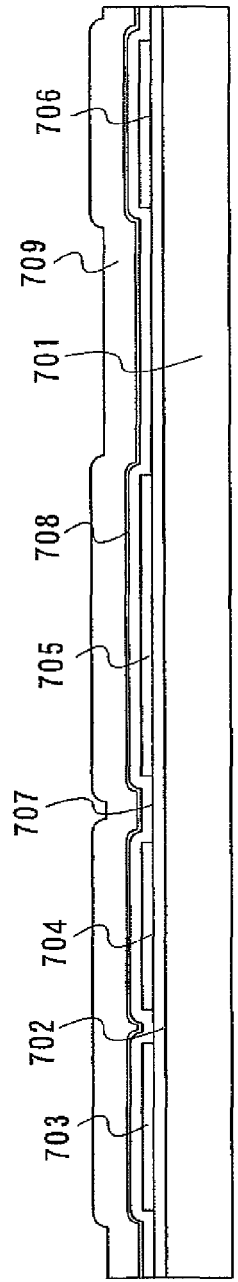
FIGS. 7A to 7C are diagrams illustrating a manufacturing method of a display device according to Embodiment Mode 6.

First, a substrate 701 over the surface of which is formed a base film 702 is provided as shown in FIG. 7A. The substrate may be the one described in Embodiment Mode 1. In this embodiment mode, a base film, which has stacked layers of a silicon nitride oxide film with a thickness of 100 nm and a silicon oxide film with a thickness of 200 nm, is formed over a glass substrate. At this time, the concentration of nitrogen of the film in contact with the substrate is preferably set at 10 to 25 wt %. Needless to say, elements may be directly formed on the substrate without providing the base film.

Then, an amorphous silicon film is formed by a known deposition method with a thickness of 45 nm over the base film 702. Note that the invention is not limited to the amorphous silicon film, and a semiconductor film having an amorphous structure (including a micro-crystalline semiconductor film) may be formed. Further, a compound semiconductor film having an amorphous structure such as an amorphous silicon germanium film may be used as well.

Then, the amorphous silicon film is crystallized by laser crystallization. Needless to say, not only the laser crystallization, but also thermal crystallization by RTA or by use of an annealing furnace may be combined as well as the thermal crystallization using metal elements for promoting crystallization.

According to the aforementioned laser crystallization, a partially crystallized region is formed in the amorphous semiconductor film.

Then, the crystalline semiconductor film having partially enhanced crystallinity is patterned into desired shapes, thereby forming island-like semiconductor films 703 to 706. Note that channel doping may be performed to the semiconductor films 703 to 706 if necessary for controlling the threshold voltage of TFTs.

Then, a gate insulating film 707 is formed covering the island-like semiconductor films 703 to 706. The gate insulating film 707 is formed by plasma CVD or sputtering with a thickness of 40 to 150 nm using an insulating film containing silicon. In this embodiment mode, a silicon oxynitride film (composition ratio: Si=32%, O=59%, N=7% and H=2%) is formed by plasma CVD with a thickness of 110 nm. Needless to say, the gate insulating film is not limited to a silicon oxynitride film, and other insulating films containing silicon may be stacked in single or a plurality of layers.

In the case of using a silicon oxide film, it can be formed by plasma CVD by mixing TEOS (Tetraethyl Orthosilicate) and $O_2$ with the condition of a reaction pressure at 40 Pa, a substrate temperature at 300 to 400° C., RF (13.56 MHz) power, and a power density of 0.5 to 0.8/cm². The silicon oxide film formed in this manner can provide favorable characteristics as the gate insulating film by subsequently applying thermal annealing at 400 to 500° C.

Subsequently, a first conductive film 708 and a second conductive film 709 to be a gate electrode is formed over the gate insulating film 707. First, the first conductive film 708 is formed with a thickness of 5 to 50 nm, and the second conductive film is formed with a thickness of 150 to 500 nm. The first conductive film 708 and the second conductive film 709 can be formed by using the same materials as those described in Embodiment Mode 1, and in this embodiment mode, the first conductive film is formed of a tantalum film (Ta) while the second conductive film is formed of a tungsten film (W).

Figure 7B:
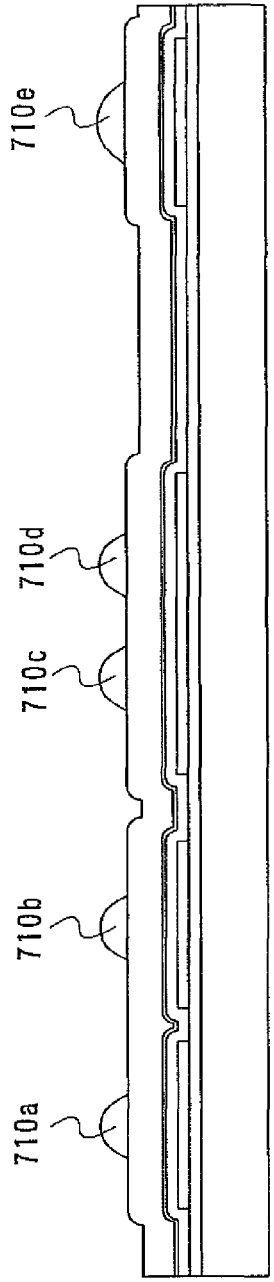

As shown in FIG. 7B, tapered resists 710a to 710e are formed. The tapered resists 710a to 710e can be formed by a known method.

Figure 7C:
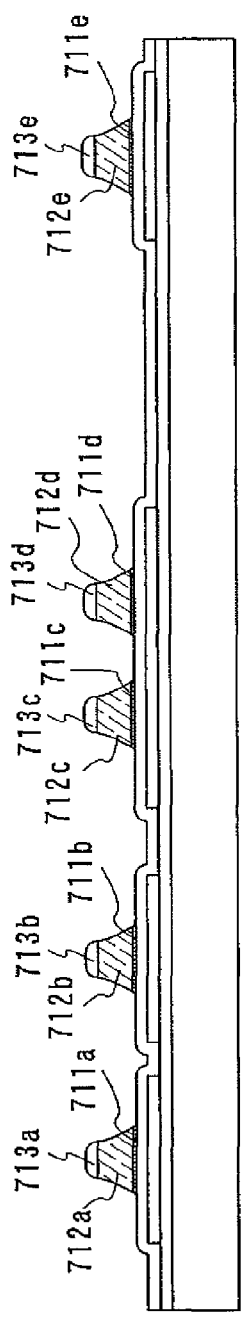

Subsequently, the first dry etching is performed (see FIG. 7C). In the first dry etching, the tapered resists 710a to 710e, the first conductive film 708 and the second conductive film 709 are etched to form tapered first gate electrodes 711a to 711e and tapered second gate electrodes 712a to 712e. Note that the resists 710a to 710e are also etched to be resists 713a to 713e having changed shapes.

The dry etching in this embodiment mode can be performed by using ICP (inductively Coupled Plasma) etching.

Subsequently, the first doping is performed as shown in FIG. 8A. N-type impurity elements (phosphorous in this embodiment mode) are doped so as to form impurity regions 801a to 801i containing a high concentration of phosphorous. Here, ion doping is performed using phosphin ($PH_3$), and the concentration of phosphorous in this region is controlled to be $1\times10^{20}$ to $1\times10^{21}$ atoms/cm$^3$ (typically, $2\times10^{20}$ to $5\times10^{20}$ atoms/cm$^3$).

Subsequently, the second dry etching is performed. Etching is performed in the perpendicular direction to the second gate electrodes 712b to 712c using the resists 713a to 713e as masks. Accordingly, second gate electrodes 802a to 802e are formed (see FIG. 8B).

Subsequently, the second doping is performed (see FIG. 8B). In the second doping, N-type impurity elements (phosphorous in this embodiment mode) are doped in a self-aligned manner at a lower concentration than in the first doping using the resists 713a to 713e and the second gate electrodes 802b to 802e as masks. The impurity regions 803a to 803e formed in this manner are preferably doped with phosphorous at a concentration of $1\times10^{16}$ to $5\times10^{18}$ atoms/cm$^3$ (typically, $3\times10^{17}$ to $3\times10^{18}$ atoms/cm$^3$).

Subsequently, the resists 713a to 713e are removed, thereby forming a resist 804 as shown in FIG. 8C. Then, the third dry etching is performed. Then, portions of the first gate electrodes 711a, 711c and 711d are etched, thereby first gate electrodes 805a, 805c and 805d are obtained.

Note that when the third dry etching is performed after forming the resist 804 without removing the resists 713a to 713e, etching may be performed using a mixed gas of $Cl_2$ and $CF_4$ as an etching gas with the condition of the flow rate at 30/30 sccm, an internal pressure of the chamber at 1.5 Pa by means of an evacuation system, a coiled electrode of an ICP etching apparatus applied with an RE (13.56 MHz) power of 500 W, and the substrate applied with an RF (13.56 MHz) power of 20 W.

Subsequently, a resist 901 is formed, and the third doping is performed (see FIG. 9A). In the third doping, P-type impurity elements (boron in this embodiment mode) are doped into the impurity regions 801a, 801b and 803a that have been the N-type impurity regions in the third doping at a concentration of $3\times10^{20}$ to $3\times10^{21}$ atoms/cm$^3$ typically, $5\times10^{20}$ to $1\times10^{21}$ atoms/cm$^3$) by ion doping using diborane ($B_2H_6$), thereby forming impurity regions 902 and 903 containing a high concentration of boron. In this manner, the impurity regions 902 and 903 function as a source region and a drain region of a P-channel TFT.

Subsequently, the resist 901 is removed as shown in FIG. 9B. After that, sidewalls 904a to 904e are formed on opposite sides of the second gate electrodes 802a to 802e. The sidewalls 904 to 904e are formed by the fourth dry etching after forming a silicon compound film as shown in Embodiment Mode 1.

Then, a resist mask 905 is formed, and the fifth dry etching is performed. Then, as shown in FIG. 9C, a portion of the first gate electrode 711e is etched to obtain a first gate electrode 906e.

After that, N-type or P-type impurity elements each doped at the aforementioned concentration are activated. The activation is performed by laser annealing. When using laser annealing, the laser used in crystallization can be used again.

Subsequently, a passivation film 1001 is formed with a thickness of 50 to 500 nm (typically, 200 to 300 nm). This can be substituted with a silicon oxide film, a silicon nitride film, a silicon nitride oxide film or a lamination of these films.

Then, an organic resin film 1002 is formed with a thickness of 1.6 μm over the passivation film 1001. The organic resin may be formed of polyimide, acrylic, BCB (benzocyclobutene) or the like. Among them, an acrylic film having superior planarity is preferably used as it is necessary to flatten the steps resulting from TFTs. Furthermore, another passivation film may be formed over the organic resin film.

Figure 10A:
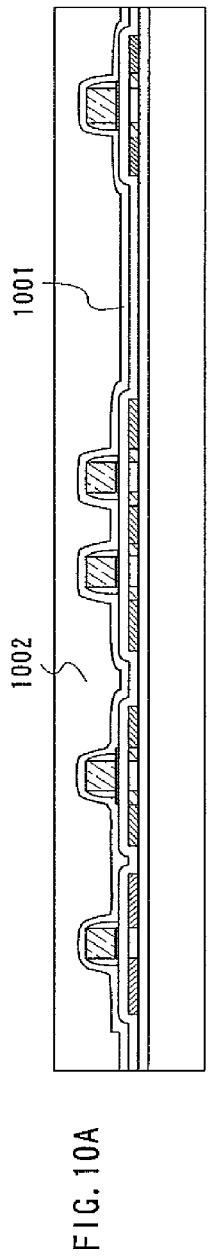
FIGS. 10A to 10C are diagrams illustrating a manufacturing method of a display device according to Embodiment Mode 6.
Figure 10B:
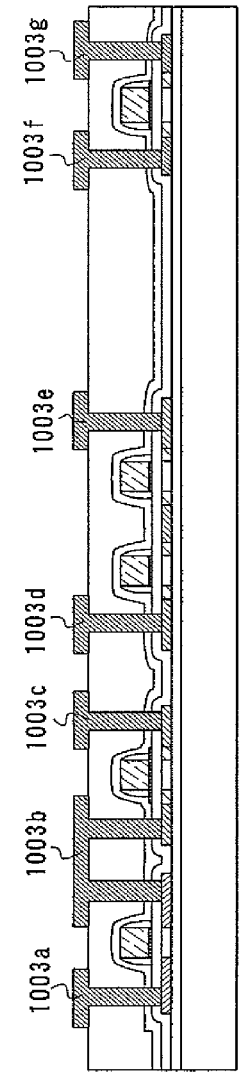

Then, as shown in FIG. 10B, contact holes are formed in the passivation film 1001 and the organic resin film 1002, thereby forming source and drain wirings 1003a to 1003g. Note that in this embodiment, each of these electrodes has a three-layer structure obtained by continuously stacking a Ti film (100 nm), an aluminum film containing Ti (300 nm) and a Ti film (150 nm) by sputtering. Needless to say, other conductive films may be formed.

Subsequently, a pixel electrode 1004 is formed in contact with the drain wiring 1003f. The pixel electrode 1004 is formed by patterning a light transmitting conductive film. The pixel electrode 1004 functions as an anode of a light emitting element. The light transmitting conductive film may be formed of a compound of indium oxide and tin oxide, a compound of indium oxide and zinc oxide, zinc oxide, tin oxide, or indium oxide.

After the formation of the pixel electrode, a bank 1005 is formed by using a resin material. The bank 1005 is formed by patterning an acrylic film or a polyimide film with a thickness of 1 to 2 μm so that a portion of the pixel electrode 1004 is exposed. Note that a black film to serve as a black matrix (not shown) may be provided under the bank 1005 if necessary.

Then, an EL layer 1006 and a cathode (MgAg electrode) 1007 are formed continuously by vacuum vapor deposition without being exposed to the atmosphere. Note that the EL layer 1006 may be formed with a thickness of 80 to 200 nm (typically, 100 to 120 nm) while the cathode 1007 may be formed with a thickness of 180 to 300 nm (typically, 200 to 250 nm).

In this step, an EL layer and a cathode are formed in each pixel corresponding to red color, green color and blue color. However, the EL layer is required to be formed individually for each color without using photolithography since it has low resistance to a solution. Therefore, it is preferable that pixels other than the predetermined pixels be covered with a metal mask to selectively form an EL layer and a cathode in necessary portions.

That is, a mask for covering pixels other than the pixels corresponding to red color is set, and an EL layer for red emission and a cathode are selectively formed. Then, a mask for covering pixels other than the pixels corresponding to green color is set, and an EL layer for green emission and a cathode are selectively formed. Subsequently, a mask for covering pixels other than the pixels corresponding to blue color is set, and an EL layer for blue emission and a cathode are selectively formed. Note that different masks are used for each color in this description, however, the same mask may be used. In addition, it is preferable to maintain vacuum until the formation of the EL layers and the cathodes in the whole pixels.

Note that the EL layer 1006 may be formed of a known material. As a known material, an organic material is preferably used in consideration of a drive voltage. For example, an EL layer having a four-layer structure of a hole injection layer, a hole transporting layer, a light emitting layer and an electron injection layer may be formed. In addition, shown in this embodiment mode is the example of using a MgAg electrode as a cathode of the EL element, however, other known materials may be used.

Upon the formation of up to the cathode 1007, a light emitting element 1008 is competed. After that, a protective film 1009 is formed covering the entire light emitting element 1008. The protective layer 1009 may be formed of a carbon film, a silicon nitride film, or an insulating film including a silicon nitride oxide film. Such insulating films may be stacked in single or laminated layers.

Further, a sealant 1010 is provided to cover the protective film 1009, and a covering material 1011 is stuck thereto. The sealant 1010 is an ultraviolet light curable resin, which preferably contains a hygroscopic substance or an antioxidant substance. Further, in this embodiment mode, the covering material 1011 may be formed of a glass substrate, a quartz substrate or a plastic substrate.

Figure 10C:
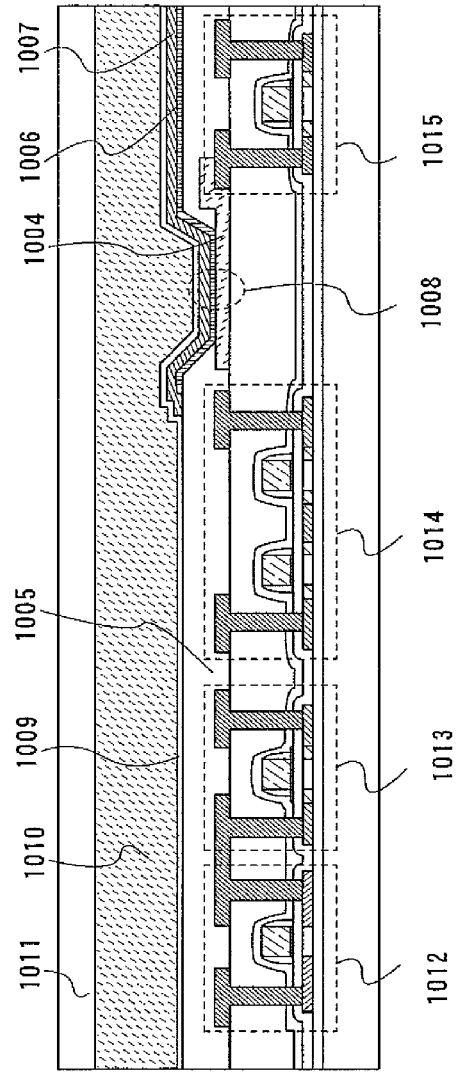

In this manner, an active matrix EL display device comprising a P-channel TFT 1012, an N-channel TFT 1013, a switching TFT 1014, and a current controlling TFT 1015 as shown in FIG. 10C is completed.

Figure 11:
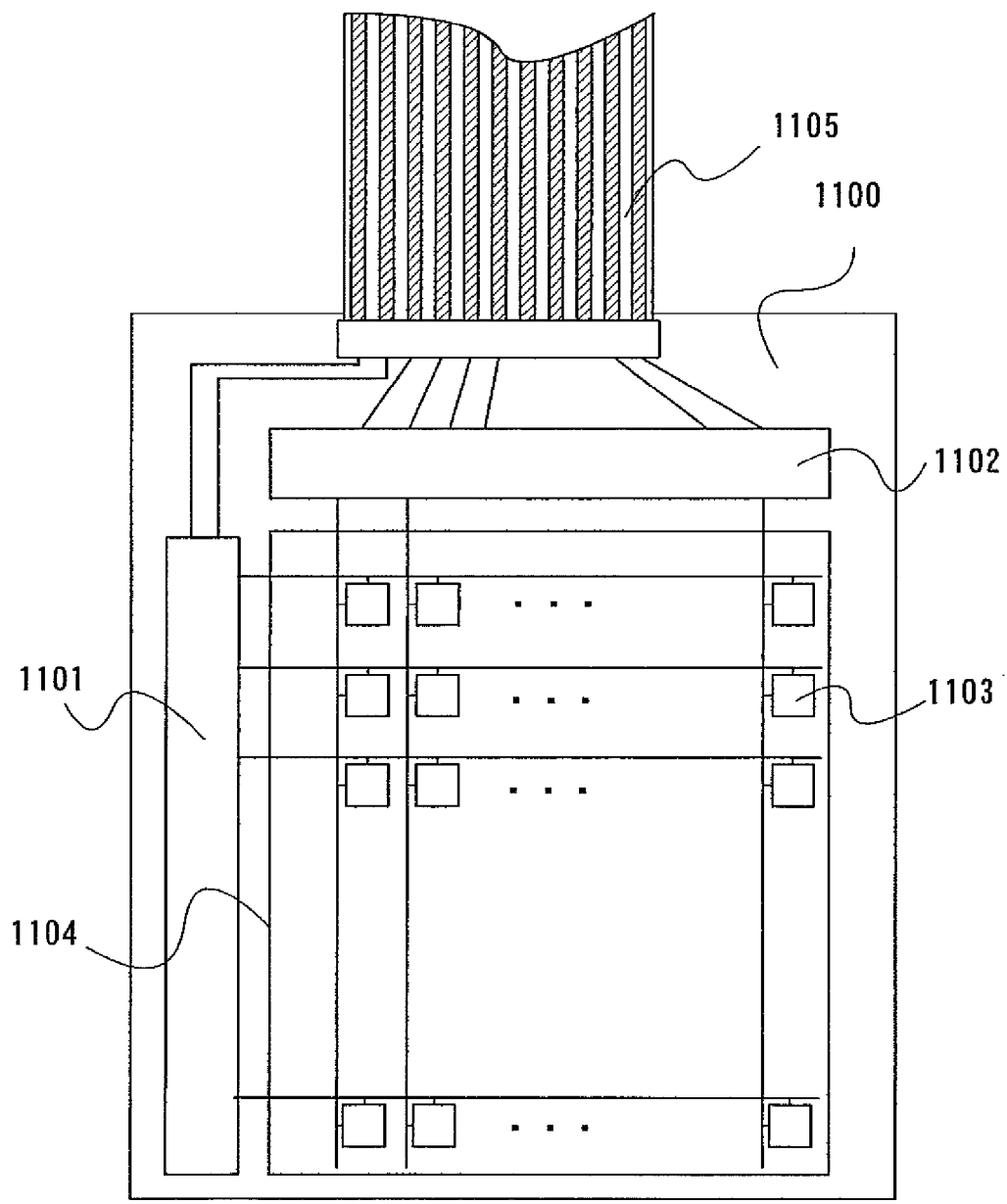
FIG. 11 is a schematic diagram illustrating a display device that can be manufactured by a manufacturing method of a display device shown in Embodiment Mode 6.

FIG. 11 illustrates a schematic view of a display device. Over a substrate 1100, a gate signal line driver circuit 1101, a source signal line driver circuit 1102, and a pixel portion 1104 including a plurality of pixels 1103 are formed. The gate signal line driver circuit 1101 and the source signal line driver circuit 1102 are connected to an FPC (Flexible Printed Circuit) 1105. The P-channel TFT 1012 and the N-channel TFT 1013 in FIG. 10C can be used in the source signal line driver circuit or the gate signal line driver circuit.

The source signal line driver circuit 1102 includes a shift register circuit, a level shifter circuit and a sampling circuit. A clock signal (CLK) and a start pulse (SP) are inputted to the shift register circuit, which outputs a sampling signal for sampling a video signal. The sampling signal outputted from the shift register is inputted to the level shifter circuit, whereby the signal is amplified. The amplified sampling signal is then inputted to the sampling circuit. The sampling circuit samples a video signal inputted externally, and inputs it to the pixel portion.

Such driver circuits require high-speed operations, therefore, a TFT having a GOLD structure is preferably used. This is also because a Lov region has a function to alleviate a high electric field generated in the vicinity of a drain, which can prevent hot carrier degradation. Thus, it can be suitably used for an N-channel TFT of a shift register circuit, a level shifter circuit, a buffer circuit and the like in the driver circuit. On the other hand, a switching TFT for a pixel or a storage TFT for storing a gate voltage of a current controlling TFT is preferably formed of a TFT having a Loff region that is capable of decreasing off-current. As for the sampling circuit, it is preferably constructed by a TFT having both Lov and Loff regions since it requires a measure against hot carrier degradation and a measure for small-off current.

Needless to say, the invention is not limited to a display device having the above structure, and can be applied to the manufacture of various display devices.

Embodiment Mode 7

The manufacturing method of a semiconductor device described in Embodiment Modes 1 to 4, and the manufacturing method of a display device described in Embodiment Mode 6 (hereinafter collectively referred to as a manufacturing method of a display device described in Embodiment Mode 6 and the like) can be applied to the manufacture of display portions of various electronic apparatuses and the like. Such electronic apparatuses include, for example, a television set, a video camera, a digital camera, a goggle display (head mounted display), a navigation system, a sound reproducing apparatus (e.g., a car audio and an audio component stereo), a personal computer, a game machine, a portable information terminal (e.g., a mobile computer, a portable phone, a portable game machine and an electronic book), and an image reproducing apparatus provided with a recording medium (specifically, a device for reproducing a recording medium such as a Digital Versatile Disk (DVD), and having a display for displaying the reproduced image). Specific examples of such electronic apparatuses are shown in FIGS. 12A to 12H.

Figure 12A:
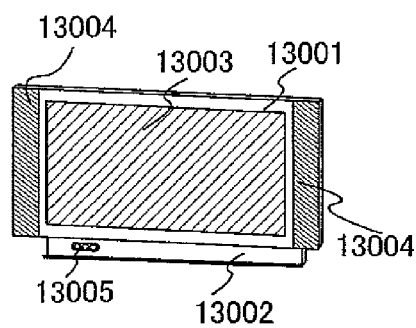
FIGS. 12A to 12H are views of electronic apparatuses shown in Embodiment Mode 7.

FIG. 12A illustrates a television set that includes a housing 13001, a supporting base 13002, a display portion 13003, a speaker portion 13004, a video input terminal 13005 and the like. The manufacturing method of a display device described in Embodiment Mode 6 and the like can be applied to the manufacturing process of the display portion 13003 and the like to complete the television set. The display portion 13003 may be an EL display, a liquid crystal display and the like. Note that the television set includes all television sets such as the ones for computers, TV broadcast reception and advertisement display.

Figure 12B:
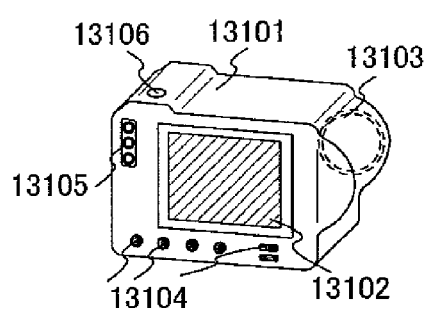

FIG. 12B illustrates s digital camera that includes a main body 13101, a display portion 13102, an image receiving portion 13103, operating keys 13104, an external connecting port 13105, a shutter 13106 and the like. The manufacturing method of a display device described in Embodiment Mode 6 and the like can be applied to the manufacturing process of the display portion 13102 and the like to complete the digital camera.

Figure 12C:
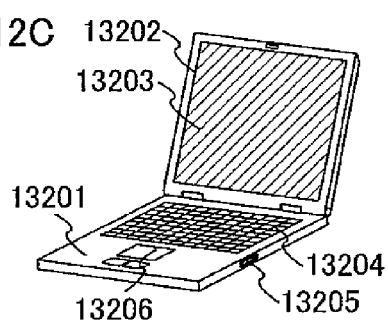

FIG. 12C illustrates a computer that includes a main body 13201, a housing 13202, a display portion 13203, a keyboard 13204, an external connecting port 13205, a pointing mouse 13206 and the like. The manufacturing method of a display device described in Embodiment Mode 6 and the like can be applied to the manufacturing process of the display portion 13203 and the like to complete the computer.

Figure 12D:
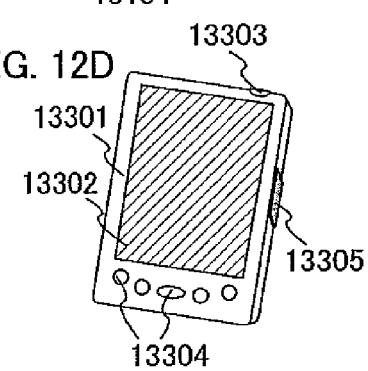

FIG. 12D illustrates a mobile computer that includes a main body 13301, a display portion 13302, a switch 13303, operating keys 13304, an IR port 13305 and the like. The manufacturing method of a display device described in Embodiment Mode 6 and the like can be applied to the manufacturing process of the display portion 13302 and the like to complete the mobile computer.

Figure 12E:
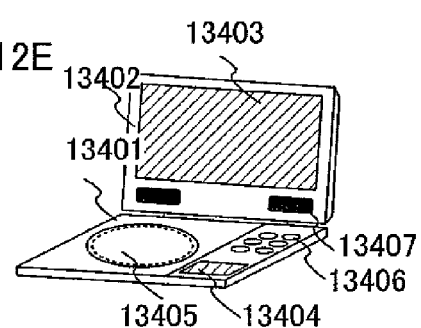

FIG. 12E illustrates an image reproducing apparatus provided with a recording medium (specifically, DVD reproducing device), which includes a main body 13401, a housing 13402, a display portion A13403, a display portion B13404, a recording medium (e.g., DVD) reading portion 13405, an operating key 13406, a speaker portion 13407 and the like. The display portion A13403 mainly displays image data while the display portion B13404 mainly displays text data. The manufacturing method of a display device described in Embodiment Mode 6 and the like can be applied to the manufacturing process of the display portion A13403, the display portion B13404 and the like to complete the image reproducing apparatus. Note that the image reproducing apparatus provided with a recording medium includes a game machine and the like.

Figure 12F:
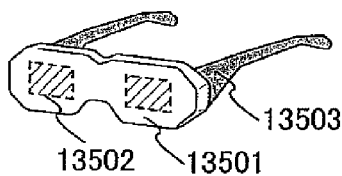

FIG. 12F illustrates a goggle display (head mounted display) that includes a main body 13501, a display portion 13502, an arm portion 13503 and the like. The manufacturing method of a display device described in Embodiment Mode 6 and the like can be applied to the manufacturing process of the display portion 13502 and the like to complete the goggle display device.

Figure 12G:
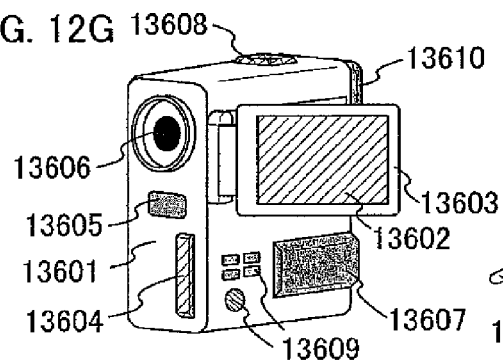

FIG. 12G illustrates a video camera that includes a main body 13601, a display portion 13602, a housing 13603, an external connecting port 13604, a remote controller receiving portion 13605, an image receiving portion 13606, a battery 13607, an audio input portion 13608, operating keys 13609 an eye piece 13610 and the like. The manufacturing method of the display device described in Embodiment Mode 6 can be applied to the manufacturing process of the display portion 13602 and the like to complete the video camera.

Figure 12H:
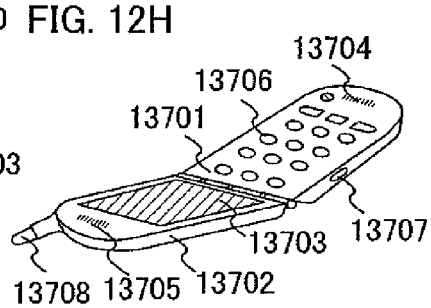

FIG. 12H illustrates a portable phone that includes a main body 13701, a housing 13702, a display portion 13703, an audio input portion 13704, an audio output portion 13705, an operating key 13706, an external connecting port 13707, an antenna 13708 and the like. The manufacturing method of a display device described in Embodiment Mode 6 and the like can be applied to the manufacturing process of the display portion 13703 to complete the portable phone. Note that power consumption of the portable phone can be suppressed by displaying white text on a black background of the display portion 13703.

In particular, the display device used for the display portion of such electronic apparatuses includes thin film transistors for driving pixels, and desired structures of the TFTs differ according to the circuit. By applying the invention, TFTs having suitable, structures for each of the various circuits can be manufactured with high accuracy, whereby a high-quality electronic apparatus can be manufactured with high yield.

As set forth above, the applicable range of the invention is quite wide, and the invention can thus be applied to electronic apparatuses of various fields.

Embodiment 1

Description is made now with reference to FIGS. 6A to 6C, 1A to 1D and 2A to 2C on the manufacturing steps using a tapered resist pattern with a line width of 2.2 μm in the step of Embodiment Mode 1. Common portions are denoted by common reference numerals.

Figure 1B:
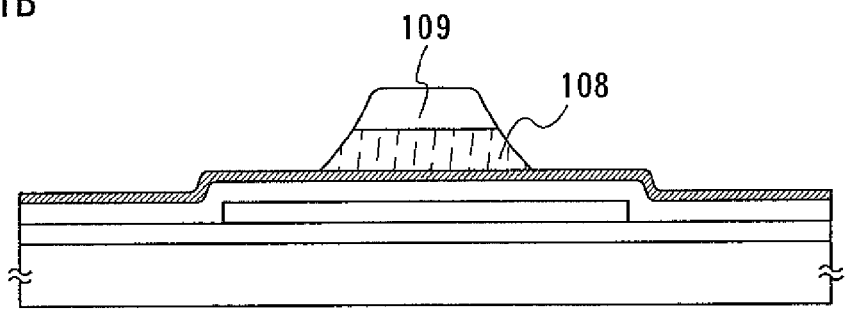
Figure 1C:
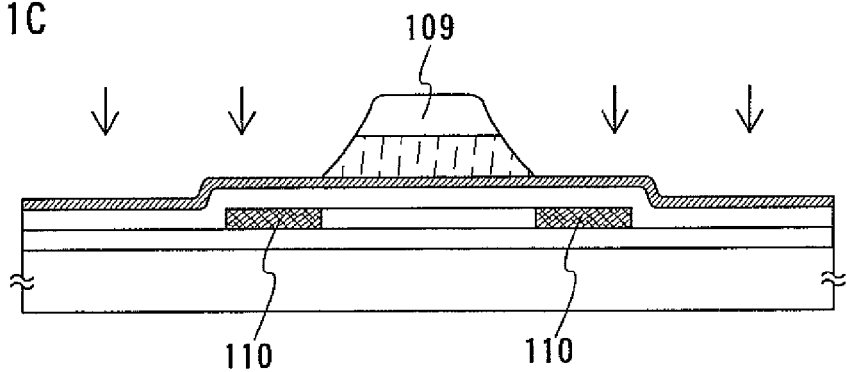
Figure 1D:
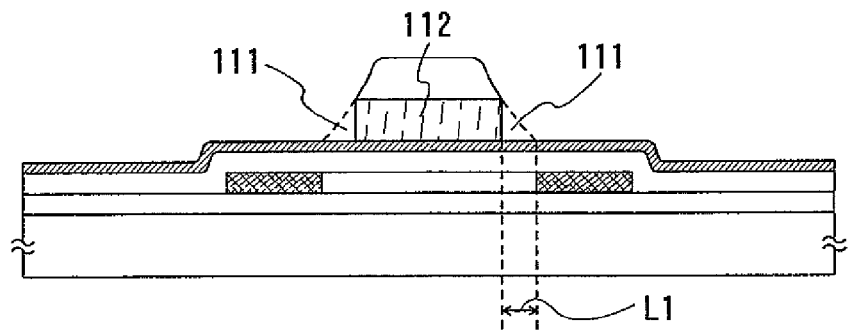
Figure 6A:
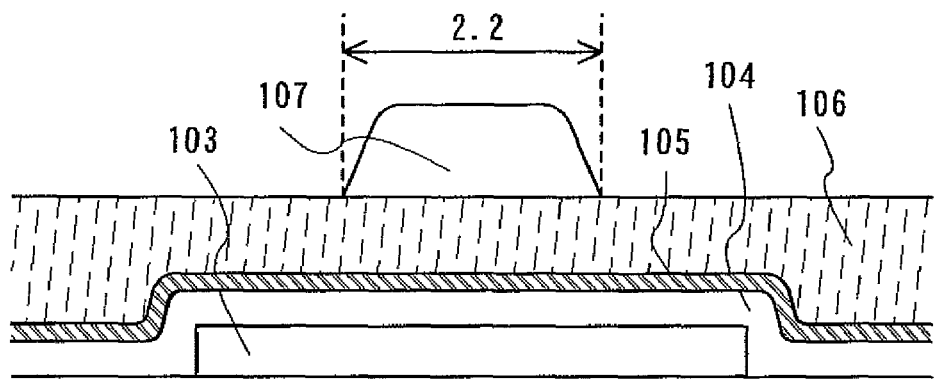
FIGS. 6A to 6C are diagrams illustrating a manufacturing method of a semiconductor device according to Embodiment 1.
Figure 6B:
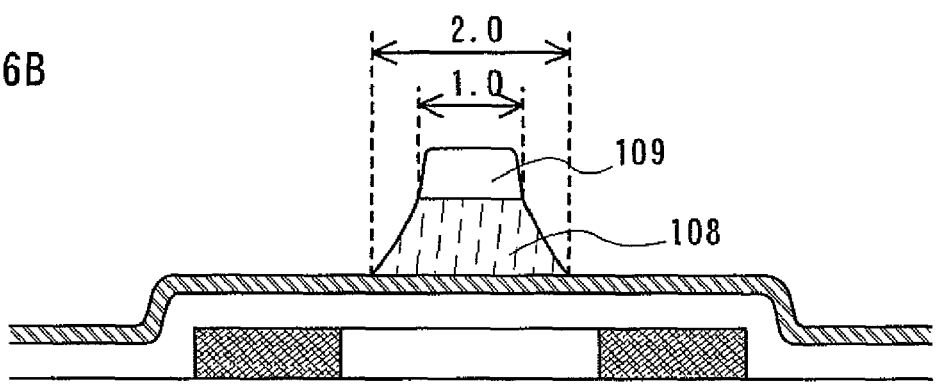
Figure 6C:
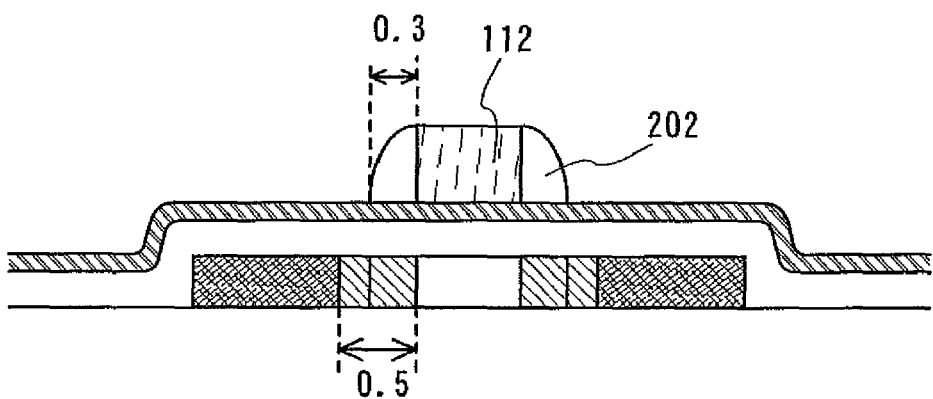

Through similar steps to those in Embodiment Mode 1, the state of FIG. 6A is obtained correspondingly to FIG. 1A. At this time, the resist 107 has a line width of 2.2 μm and a tapered shape.

Then, the tapered resist with the line width of 2.2 μm is etched together with the second conductive film 106 by the first dry etching, thereby the second gate electrode 108 is formed to have a tapered shape (see FIG. 6). At this time, the resist 107 is also etched to form the resist 109. After the etching, the resist 109 has a line width of 0.7 to 1.0 μm, and the bottom side of the second gate electrode 108 has a line width of 2.0 μm. That is, each side of the tapered portion has a line width of 0.5 μm.

The dry etching in this embodiment mode can be performed by using ICP (Inductively Coupled Plasma) etching. The first dry etching is performed using a mixed gas of $Cl_2$, $CF_4$ and $O_2$ as an etching gas with the condition of the flow rate at 25/25/10 sccm, an internal pressure of the chamber at 1.5 Pa by means of an evacuation system, a coiled electrode of an ICP etching apparatus applied with an RF (13.56 MHz) power of 500 W, and the substrate applied with an RF (13.56 MHz) power of 50 W.

Subsequently, the first doping is performed by a similar method to that in Embodiment Mode 1 to form a source region and a drain region (see FIG. 1C).

Then, the second dry etching is performed. Etching is performed in the perpendicular direction using the resist 107 as a mask, thereby removing the tapered portion of the second gate electrode to expose the semiconductor layer 103 (see FIG. 1D). The exposed region in which no impurities are doped has the same line width as the region of the tapered portion, therefore, it is 0.5 μm wide one side. Here, to expose the semiconductor layer means to remove a portion to be a mask in the subsequent doping step, and does not necessarily mean that the semiconductor layer 103 is exposed to the surface. Accordingly, it is needless to mention that the gate insulating film 104 and the first conductive film 105 are not removed by etching.

The second dry etching is performed by using a mixed gas of $Cl_2$, $CF_4$ and $O_2$ as an etching gas with the condition of the flow rate at 12/24/24 sccm, an internal pressure of the chamber at 2.0 Pa by means of an evacuation system, and a coiled electrode of an ICP etching apparatus applied with an RF (13.56 MHz) power of 700 W.

Subsequently, the second doping is performed to the conductive layer 103. The second doping is performed to the semiconductor layer under the tapered portion of the second gate electrode 108 that is removed by the subsequent second dry etching, to which the first doping is not performed (see FIG. 2A). That is, the semiconductor layer with the line width of 0.5 μm under the tapered portion of the second gate electrode becomes the LDD region 201. That is, the semiconductor layer of the region where the first doping and the second doping are not performed, namely the semiconductor layer with the line width of 1.0 μm that corresponds to the line width of the resist 109 becomes a channel formation region.

Subsequently, the resist 109 is removed, and a silicon oxide film is formed by CVD with a thickness of 0.5 μm so as to cover the second gate electrode. Then, the silicon oxide film is etched back by the third dry etching to form a sidewall 202 on opposite sides of the second gate electrode. The sidewall has a line width of 0.3 μm (see FIG. 6C).

The third dry etching is performed using a mixed gas of $CHF_3$ and Ar as an etching gas with the condition of the flow rate at 25/250 sccm, an internal pressure of the chamber at 8.0 Pa by means of an evacuation system, a coiled electrode of an ICP etching apparatus applied with an RF (13.56 MHz) power of 200 W, and the substrate applied with an RF (13.56 MHz) power of 350 W.

Subsequently, the fourth dry etching is performed using the second gate electrode 112 and the sidewall 202 as masks (see FIG. 2C). According to this etching, the first gate electrode is etched to form a LDD region that does not overlap the first gate electrode. The LDD region of the portion that does not overlap the gate electrode is referred to as a Loff region, of which line width is 0.2 μm. The Loff region is formed for decreasing off-current. Meanwhile, the LDD region of the portion that overlaps the first gate electrode remaining without being etched due to the sidewall as a mask is referred to as a Lov region. The Lov region has an approximately equal line width to the sidewall, which is 0.3 μm (see FIG. 6C and 2C). The Lov region is formed to prevent hot carrier degradation.

The fourth dry etching is performed using a mixed gas of $Cl_2$ as an etching gas with the condition of the flow rate at 60 sccm, an internal pressure of the chamber at 1.0 Pa by means of an evacuation system, a coiled electrode of an ICP etching apparatus applied with an RF (13.56 MHz) power of 350 W, and the substrate applied with an RF (13.56 MHz) power of 20 W.

According to the manufacturing method of a semiconductor device of the invention, a semiconductor device having superior TFT characteristics can be manufactured through the simplified steps as compared to the formation steps of a LDD region by use of a resist mask since Lov and Loff regions are formed in a self-aligned manner by transforming a gate electrode into a different shape.

In addition, in the case of etching the resist and the gate electrode to serve as doping masks in the lateral direction in order to form a LDD region, for example, it is difficult to evaluate the etching rate in the lateral direction. Therefore, a stable process cannot be established. However, as described in this embodiment mode, by using a tapered resist to form a tapered gate electrode, and etching perpendicularly the tapered portion of the gate electrode using the resist instead of using an additional resist, it becomes possible to form a LDD region with high controllability. In particular, this embodiment mode is suitable for the manufacture of a semiconductor device comprising fine TFTs (fine TFTs formed by using a stepper in the photolithography step).

The present application is based on Japanese Priority application No. 2004-113724 filed on Apr. 18, 2004 with the Japanese Patent Office, the entire contents of which are hereby incorporated by reference.

What is claimed is:

1. A semiconductor device comprising:
a substrate having an insulating surface;
an island-like semiconductor layer over the substrate, the island-like semiconductor layer including a source region, a drain region, low concentration impurity regions of which an impurity concentration is lower than that of the source and drain regions, and a channel region;
a gate insulating film formed over the island-like semiconductor layer;
a first gate electrode formed over the gate insulating film;
a second gate electrode of which a channel length direction is shorter than that of the first gate electrode, the second gate electrode being over the first gate electrode; and
sidewalls formed of an insulating film, the sidewalls being located on opposite skies of the second gate electrode in a channel length direction,
wherein the first gate electrode partially overlaps the low concentration impurity regions with the gate insulating film interposed therebetween,
wherein a length of the first gate electrode that overlaps the low concentration impurity regions is substantially equal to a length of the sidewalls, and
wherein the low concentration impurity regions are formed between the channel region and the source region and between the channel region and the drain region.

2. An electronic device comprising the semiconductor device according to claim 1, wherein the electronic device is selected from the group consisting of a television set, a video camera, a digital camera, a goggle display, head mounted display, a navigation system, a sound reproducing apparatus, a car audio, an audio component stereo, a personal computer, a game machine, a portable information terminal, a mobile computer, a portable phone, a portable game machine, an electronic book, an image reproducing apparatus provided with a recording medium, and an ID chip.

3. The semiconductor device according to claim 1, wherein the insulating film comprises a material selected from the group consisting of silicon oxide, silicon nitride and silicon oxynitride.

4. The semiconductor device according to claim 1, wherein the first gate electrode comprises one selected from the group consisting of aluminum, copper, chromium, tantalum, tantalum nitride, titanium, tungsten, and molybdenum.

5. The semiconductor device according to claim 1, wherein the second gate electrode comprises one selected from the group consisting of chromium, tantalum, titanium, tungsten, aluminum, and tantalum.

6. A semiconductor device comprising:
a substrate having an insulating surface;
an island-like semiconductor layer including a source region, a drain region, low concentration impurity regions of which an impurity concentration is lower than that of the source and drain regions, and a channel region formed over the substrate;
a gate insulating film formed over the island-like semiconductor layer;
a first gate electrode formed over the gate insulating film;
a second gate electrode of which a channel length direction is shorter than that of the first gate electrode over the first gate electrode;
sidewalls formed of an insulating film, the sidewalls being located on opposite sides of the second gate electrode in the channel length direction;
an interlayer insulating film formed over the second gate electrode; and
a pixel electrode over the interlayer insulating film,
wherein the first gate electrode partially overlaps the low concentration impurity regions with the gate insulating film interposed therebetween,
wherein a length of the first gate electrode that overlaps the low concentration impurity regions is substantially equal to a length of the sidewalls, and
wherein the low concentration impurity regions are formed between the channel region and the source region and between the channel region and the drain region.

7. The semiconductor device according to claim 6, wherein the insulating film comprises a material selected from the group consisting of silicon oxide, silicon nitride and silicon oxynitride.

8. The semiconductor device according to claim 6, wherein the first gate electrode comprises one selected from the group consisting of aluminum, copper, chromium, tantalum, tantalum nitride, titanium, tungsten, and molybdenum.

9. The semiconductor device according to claim 6, wherein the second gate electrode comprises one selected from the group consisting of chromium, tantalum, titanium, tungsten, aluminum, and tantalum.

10. An electronic device comprising the semiconductor device according to claim 6, wherein the electronic device is selected from the group consisting of a television set, a video camera, a digital camera, a goggle display, head mounted display, a navigation system, a sound reproducing apparatus, a car audio, an audio component stereo, a personal computer, a game machine, a portable information terminal, a mobile computer, a portable phone, a portable game machine, an electronic book, an image reproducing apparatus provided with a recording medium, and an ID chip.

11. A semiconductor device comprising:
a substrate having an insulating surface;
a switching thin film transistor over the substrate;
a current controlling thin film transistor over the substrate; and
a pixel electrode electrically connected to the current controlling thin film transistor,
wherein the current controlling thin film transistor comprises:
an island-like semiconductor layer including a source region, a drain region, low concentration impurity regions of which an impurity concentration is lower than that of the source and drain regions, and a channel region formed over the substrate;
a gate insulating film formed over the island-like semiconductor layer;
a first gate electrode formed over the gate insulating film;
a second gate electrode of which a channel length direction is shorter than that of the first gate electrode over the first gate electrode; and
sidewalls formed of an insulating film, the sidewalls being located on opposite sides of the second gate electrode in the channel length direction,
wherein the first gate electrode partially overlaps the low concentration impurity regions with the gate insulating film interposed therebetween,
wherein a length of the first gate electrode that overlaps the low concentration impurity regions is substantially equal to a length of the sidewalls, and
wherein the low concentration impurity regions are formed between the channel region and the source region and between the channel region and the drain region.

12. The semiconductor device according to claim 11, wherein the insulating film comprises a material selected from the group consisting of silicon oxide, silicon nitride and silicon oxynitride.

13. The semiconductor device according to claim 11, wherein the first gate electrode comprises one selected from the group consisting of aluminum, copper, chromium, tantalum, tantalum nitride, titanium, tungsten, and molybdenum.

14. The semiconductor device according to claim 11, wherein the second gate electrode comprises one selected from the group consisting of chromium, tantalum, titanium, tungsten, aluminum, and tantalum.

15. An electronic device comprising the semiconductor device according to claim 11, wherein the electronic device is selected from the group consisting of a television set, a video camera, a digital camera, a goggle display, head mounted display, a navigation system, a sound reproducing apparatus, a car audio, an audio component stereo, a personal computer, a game machine, a portable information terminal, a mobile computer, a portable phone, a portable game machine, an electronic book, and an image reproducing apparatus provided with a recording medium.

16. The semiconductor device according to claim 11 further comprising:
an EL layer over the pixel electrode; and
a electrode over the EL layer.

17. The semiconductor device according to claim 11, wherein the switching thin film transistor does not comprises Lov region.

18. A semiconductor device comprising:
a substrate having an insulating surface;
a switching thin film transistor over the substrate;
a current controlling thin film transistor over the substrate;
an interlayer insulating film over the current controlling thin film transistor; and
a pixel electrode electrically connected to the current controlling thin film transistor,
wherein the current controlling thin film transistor comprises:
an island-like semiconductor layer including a source region, a drain region, low concentration impurity regions of which an impurity concentration is lower than that of the source and drain regions, and a channel region formed over the substrate;
a gate insulating film formed over the island-like semiconductor layer;
a first gate electrode formed over the gate insulating film;
a second gate electrode of which a channel length direction is shorter than that of the first gate electrode over the first gate electrode; and
sidewalls formed of an insulating film, the sidewalls being located on opposite sides of the second gate electrode in the channel length direction,
wherein the first gate electrode partially overlaps the low concentration impurity regions with the gate insulating film interposed therebetween,
wherein a length of the first gate electrode that overlaps the low concentration impurity regions is substantially equal to a length of the sidewalls, and
wherein the low concentration impurity regions are formed between the channel region and the source region and between the channel region and the drain region.

19. The semiconductor device according to claim 18, wherein the insulating film comprises a material selected from the group consisting of silicon oxide, silicon nitride and silicon oxynitride.

20. The semiconductor device according to claim 18, wherein the first gate electrode comprises one selected from the group consisting of aluminum, copper, chromium, tantalum, tantalum nitride, titanium, tungsten, and molybdenum.

21. The semiconductor device according to claim 18, wherein the second gate electrode comprises one selected from the group consisting of chromium, tantalum, titanium, tungsten, aluminum, and tantalum.

22. An electronic device comprising the semiconductor device according to claim 18, wherein the electronic device is selected from the group consisting of a television set, a video camera, a digital camera, a goggle display, head mounted display, a navigation system, a sound reproducing apparatus, a car audio, an audio component stereo, a personal computer, a game machine, a portable information terminal, a mobile computer, a portable phone, a portable game machine, an electronic book, and an image reproducing apparatus provided with a recording medium.

23. The semiconductor device according to claim 11,
wherein the switching thin film transistor comprises a semiconductor film, a third gate electrode, a fourth gate electrode, and sidewalls,
wherein the switching thin film transistor includes a LDD region which does not overlap the third gate electrode and the fourth gate electrode, and
wherein the sidewalls are in contact with a side surface of the third gate electrode and the fourth gate electrode.

24. The semiconductor device according to claim 18,
wherein the switching thin film transistor comprises a semiconductor film, a third gate electrode, a fourth gate electrode, and sidewalls,
wherein the switching thin film transistor includes a LDD region which does not overlap the third gate electrode and the fourth gate electrode, and
wherein the sidewalls are in contact with a side surface of the third gate electrode and the fourth gate electrode.

25. The semiconductor device according to claim 18,
wherein the switching thin film transistor does not comprises Lov region.

* * * * *